US010811253B2

(12) United States Patent
Cheng et al.

(10) Patent No.: US 10,811,253 B2
(45) Date of Patent: Oct. 20, 2020

(54) METHODS OF FABRICATING SEMICONDUCTOR DEVICES HAVING CRYSTALLINE HIGH-K GATE DIELECTRIC LAYER

(71) Applicant: Taiwan Semiconductor Manufacturing Co., Ltd., Hsinchu (TW)

(72) Inventors: Chung-Liang Cheng, Changhua County (TW); Ziwei Fang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/281,723

(22) Filed: Feb. 21, 2019

(65) Prior Publication Data

US 2020/0273700 A1 Aug. 27, 2020

(51) Int. Cl.
| | |
|---|---|
| *H01L 21/02* | (2006.01) |
| *H01L 29/78* | (2006.01) |
| *H01L 29/51* | (2006.01) |
| *H01L 29/40* | (2006.01) |
| *H01L 27/088* | (2006.01) |

(52) U.S. Cl.
CPC .... *H01L 21/02356* (2013.01); *H01L 21/0228* (2013.01); *H01L 21/02123* (2013.01); *H01L 21/02175* (2013.01); *H01L 21/02178* (2013.01); *H01L 21/02181* (2013.01); *H01L 21/02183* (2013.01); *H01L 21/02186* (2013.01); *H01L 21/02189* (2013.01); *H01L 21/02192* (2013.01); *H01L 21/02345* (2013.01); *H01L 29/401* (2013.01); *H01L 29/517* (2013.01); *H01L 29/7851* (2013.01); *H01L 27/0886* (2013.01)

(58) Field of Classification Search
CPC ......... H01L 21/02356; H01L 21/02189; H01L 21/02186; H01L 21/02345; H01L 21/0228; H01L 21/02123; H01L 21/02175; H01L 21/02181; H01L 29/7851; H01L 21/02178; H01L 21/02183; H01L 29/517; H01L 29/401; H01L 21/02192; H01L 27/0886
See application file for complete search history.

(56) References Cited

U.S. PATENT DOCUMENTS 9,356,125 B1 * 5/2016 Hsiao .................. H01L 29/0653
2010/0219481 A1 * 9/2010 Tseng ................ H01L 21/28185
257/369

(Continued)

*Primary Examiner* — Yasser A Abdelaziez
(74) *Attorney, Agent, or Firm* — Birch, Stewart, Kolasch & Birch, LLP

(57) ABSTRACT

A method of fabricating semiconductor devices is provided. The method includes forming an interfacial layer on a substrate, and depositing a gate dielectric layer on the interfacial layer. The method also includes treating the gate dielectric layer with a first post deposition annealing (PDA) process. The method further includes depositing a first capping layer on the gate dielectric layer, and treating the gate dielectric layer by performing a post metal annealing (PMA) process on the first capping layer. In addition, the method includes removing the first capping layer, and treating the gate dielectric layer with a second PDA process. The method also includes forming a gate electrode layer on the gate dielectric layer.

20 Claims, 21 Drawing Sheets

(56) References Cited

U.S. PATENT DOCUMENTS

| | | | |
|---|---|---|---|
| 2013/0017678 A1* | 1/2013 | Tsai | H01L 21/28088 438/591 |
| 2014/0054726 A1* | 2/2014 | Takenaka | H01L 21/28202 257/411 |
| 2016/0079386 A1* | 3/2016 | Aoki | H01L 21/02205 257/330 |

* cited by examiner

ID: us-10811253-b2

METHODS OF FABRICATING SEMICONDUCTOR DEVICES HAVING CRYSTALLINE HIGH-K GATE DIELECTRIC LAYER

BACKGROUND

Semiconductor devices are used in a variety of electronic applications, such as personal computers, cell phones, digital cameras, and other electronic equipment. Semiconductor devices may be metal-oxide-semiconductor field effect transistors (MOSFETs), including planar MOSFETs and fin field effect transistors (FinFETs). As the semiconductor integrated circuit (IC) industry has progressed into nanometer process nodes in pursuit of higher device density, higher performance and lower costs, challenges from both fabrication and design issues have resulted in the development of three-dimensional designs, such as FinFETs.

The semiconductor IC industry has experienced exponential growth. Technological advances in IC materials and designs have produced generations of ICs where each generation has smaller and more complex circuits than the previous generation. This scaling down process generally provides benefits by increasing production efficiency and lowering associated costs. However, such scaling down has also increased the complexity of processing and manufacturing ICs. There are still various challenges in the fabrication of semiconductor devices.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
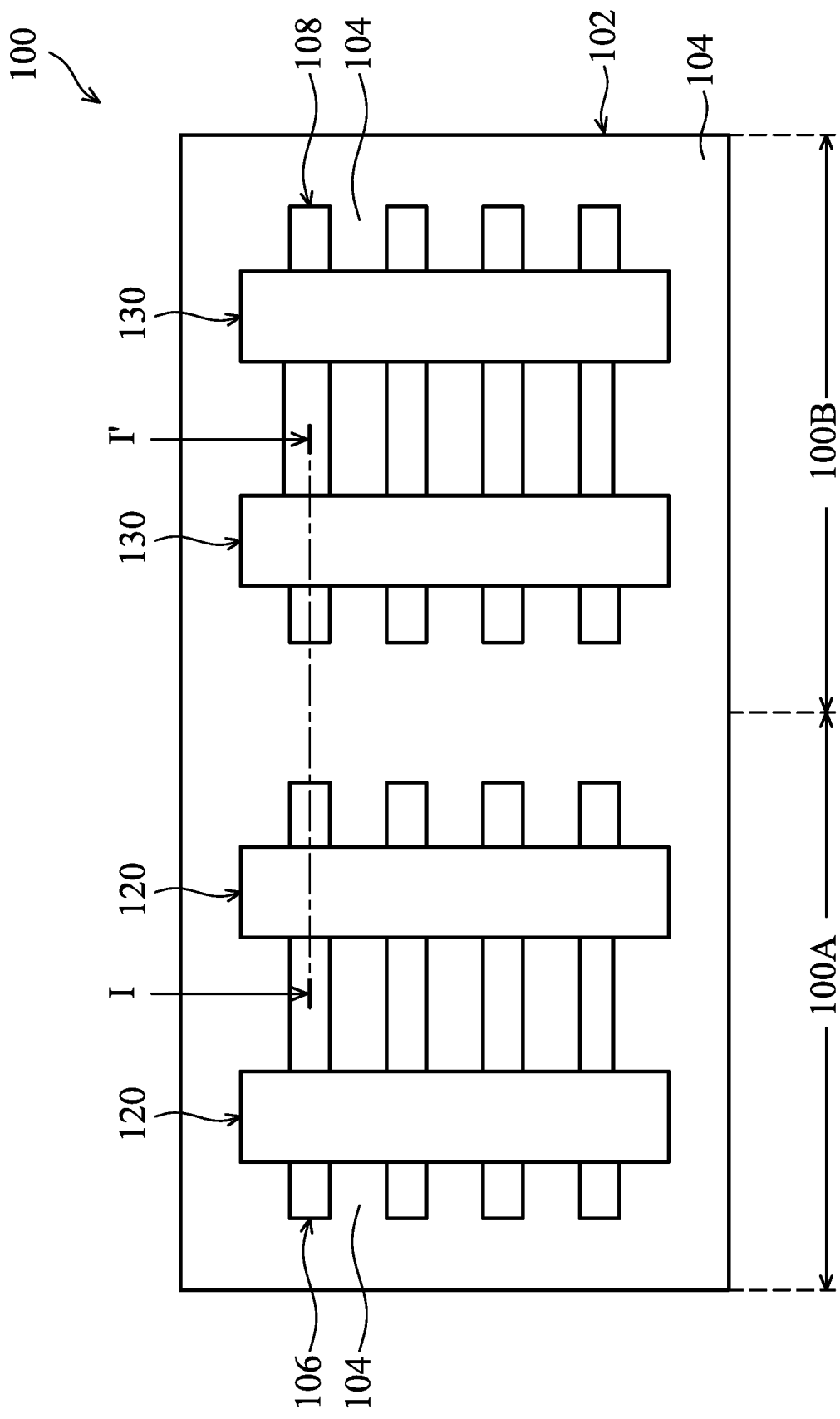
FIG. 1 shows a plane view of an intermediate structure at one stage of an exemplary method for fabricating a semiconductor device, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FinFET devices typically include semiconductor fins with high aspect ratios and channel and source/drain regions are formed in the fin. A gate structure is formed over and along the sides of the fin (e.g., wrapping) utilizing the advantage of the increased surface area of the channel to produce faster, more reliable, and better-controlled semiconductor transistor devices.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In general, for advanced technology of semiconductor devices, the most common way to improve high dielectric constant (high-k) quality of a high-k gate dielectric layer by oxygen vacancy reduction is to use a capping layer on the high-k gate dielectric layer with a post metal annealing (PMA) process. An interfacial layer (IL) is usually disposed between the high-k gate dielectric layer and a semiconductor substrate. The most common way may cause the interfacial layer (IL) regrowth by oxygen diffusion from the capping layer to the interface between the semiconductor substrate and the IL during the PMA process.

Embodiments disclosed herein relate generally to fabricating semiconductor devices having a crystalline high-k gate dielectric layer. According to embodiments of the disclosure, an amorphous high-k gate dielectric layer is deposited on an interfacial layer (IL) using atomic layer deposition (ALD) process. In addition, an ex-situ or in-situ post deposition annealing (PDA) process is performed on the amorphous high-k gate dielectric layer to form a crystalline high-k gate dielectric layer. The crystalline high-k gate dielectric can increase the dielectric constant to reduce the capacitance equivalent thickness (CET) of the gate dielectric layer and to reduce gate leakage in semiconductor devices. Moreover, the embodiments of the disclosure can avoid interfacial layer (IL) regrowth. Therefore, the performance of the semiconductor devices is improved.

The foregoing broadly outlines some aspects of the embodiments described herein. Some embodiments described herein are described in the context of FinFET devices, and more particularly, in the context of forming a crystalline high-k gate dielectric layer of the FinFET devices. Some variations of the exemplary methods and structures are described. A person having ordinary skill in the art will readily understand other modifications may be made that are contemplated within the scope of other embodiments. Implementations of some aspects of the present disclosure may be used in other processes and/or in other semiconductor devices. The semiconductor devices are for example FinFETs, planar FETs, π-gate FETs, Ω-gate FETs, Gate-All-Around (GAA) FETs, complementary metal-oxide-semiconductor (CMOS) image sensor, or another semiconductor device. Throughout the various views and illustrative embodiments, like reference numbers are used to designate like elements. Although embodiments of the method may be described in a particular order, various other embodiments of the method may be performed in any logical order and may include fewer or more steps than what is described herein.

FIG. 1 shows a plane view of an intermediate structure at one stage of an exemplary method for fabricating a semiconductor device 100 such as a FinFET device, in accordance with some embodiments. The intermediate structure of the semiconductor device 100 includes multiple dummy gate structures 120 formed on and across multiple fins 106 in a p-type device region such as a p-type metal-oxide-semiconductor (pMOS) region 100A, and multiple dummy gate structures 130 formed on and across multiple fins 108 in an n-type device region such as an n-type metal-oxide-semiconductor (nMOS) region 100B. The fins 106 and 108 are separated from each other by isolation structures 104. The fins 106 and 108, the dummy gate structures 120 and 130, and the isolation structures 104 are formed on a substrate 102. Other aspects not illustrated in or described with respect to FIG. 1 may become apparent from the following figures and description. The structure in FIG. 1 may be electrically connected or coupled in a manner to operate one or more transistors, for example eight transistors in each of the pMOS and nMOS regions.

Figure 2:
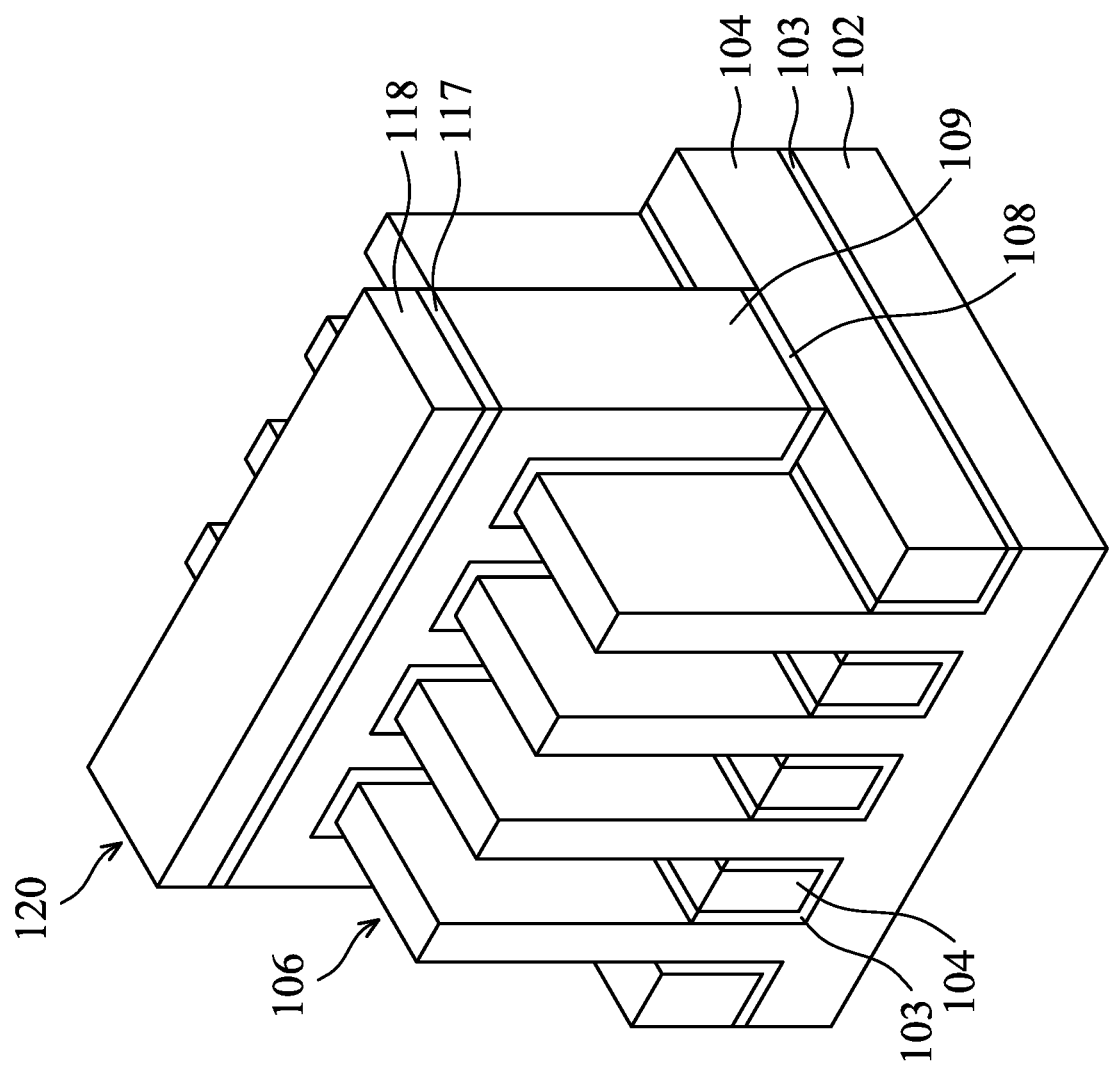
FIG. 2 shows a perspective view of an intermediate structure at one stage of an exemplary method for fabricating a semiconductor device, in accordance with some embodiments.

FIG. 2 illustrates a perspective (three-dimensional) view of an intermediate structure at one stage of an exemplary method for fabricating the semiconductor device 100, in accordance with some embodiments. The structure of FIG. 2 illustrates a portion of the semiconductor device 100 of FIG. 1 in the pMOS region 100A. Another portion of the semiconductor device 100 of FIG. 1 in the nMOS region 100B may also have the same perspective view as shown in FIG. 2. In some embodiments, multiple fins 106 protruding from the substrate 102.

The substrate 102 may be a bulk semiconductor substrate, or a semiconductor-on-insulator (SOI) substrate, which may be doped (e.g., with a p-type or an n-type dopant) to form various well regions or doped regions therein, or undoped. Generally, an SOI substrate includes a layer of a semiconductor material formed on an insulator layer. The insulator layer may be a buried oxide (BOX) layer, a silicon oxide layer, or the like. The insulator layer is provided on a silicon or glass substrate. The substrate 102 may be made of silicon or another semiconductor material. For example, the substrate 102 is a silicon wafer. In some examples, the substrate 102 is made of a compound semiconductor such as silicon germanium (SiGe), silicon carbide (SiC), gallium arsenic (GaAs), indium arsenide (InAs), indium phosphide (InP) or GaAsP. In some examples, the substrate 102 is made of an alloy semiconductor such as AlInAs, AlGaAs, GaInAs, GaInP, or GaInAsP.

The substrate 102 is patterned using photolithography and etching processes to form multiple trenches in the substrate 102. A patterned hard mask (not shown) is formed on the substrate 102 to serve as an etching mask for forming the fins 106. Each of the trenches is between neighboring pairs of the fins 106. The fins 106 are formed from the substrate 102. The etching process may include a reactive ion etch (RIE), neutral beam etch (NBE), inductive coupled plasma (ICP) etch, or a combination thereof.

Still referring to FIG. 2, multiple isolation structures 104 are formed in the trenches between the fins 106 and on the substrate 102, in accordance with some embodiments. Each of the fins 106 may protrude above the isolation structures 104. The isolation structure 104 is, for example a shallow-trench-isolation (STI) structure, which surrounds the bottom portion of the fin 106. The isolation structure 104 is formed by filling the trenches with an insulating material and then the filled insulating material is recessed by an etching process. The insulating material may be silicon oxide, silicon nitride, silicon oxynitride, fluoride-doped silicate glass (FSG), or another low dielectric constant (low-k) dielectric material. The trenches may be filled with the insulating material using a deposition process, such as chemical vapor deposition (CVD), flowable CVD (FCVD), a spin-on-glass (SOG) process, or another applicable process.

In addition, a liner 103 may be formed between the isolation structures 104 and the substrate 102, and also between the isolation structures 104 and the fins 106. A liner material layer for forming the liner 103 is conformally deposited on the sidewalls and the top surfaces of the fins 106, and on the substrate 102 before filling the trenches with the insulating material. The material of the liner 103 may be silicon oxide, silicon nitride or silicon oxynitride. The liner material layer may be deposited using CVD, physical vapor deposition (PVD) or atomic layer deposition (ALD) process. Next, the liner material layer is recessed together with the filled insulating material of the isolation structures 104 by an etching process to form the liner 103. The etching process includes RIE, NBE or another suitable etching process. The top surfaces of the isolation structure 104 and the liner 103 are lower than the top surfaces of the fins 106.

Still referring to FIG. 2, the dummy gate structure 120 is formed across the fins 106, along the sidewalls and over the top surfaces of the fins 106, in accordance with some embodiments. The dummy gate structure 120 is also formed on the isolation structures 104. The longitudinal direction of the dummy gate structure 120 is perpendicular to the longitudinal direction of the fins 106. In some embodiments of the disclosure, each of the dummy gate structures 120 in the pMOS region 100A will be replaced with a replacement gate structure in a gate-last process.

The dummy gate structure 130 is also formed across the fins 108, along the sidewalls and over the top surfaces of the fins 108. The dummy gate structure 130 is also formed on the isolation structures 104. The longitudinal direction of the dummy gate structure 130 is perpendicular to the longitudinal direction of the fins 108. In some embodiments of the disclosure, each of the dummy gate structures 130 in the nMOS region 100B will be replaced with a replacement gate structure in the gate-last process. The materials and processes of forming the replacement gate structures in the pMOS region 100A and the nMOS region 100B would be described with reference to FIGS. 3A to 3Q.

Each of the dummy gate structures 120 and 130 includes a dummy gate dielectric layer 108 and a dummy gate electrode layer 109 on the dummy gate dielectric layer 108. In some embodiments, the dummy gate electrode layer 109 is made of poly-silicon. The dummy gate dielectric layer 108 may be made of silicon oxide, silicon nitride, silicon oxynitride or another low dielectric constant (low-k) dielectric material. The dummy gate dielectric layer 108 and the dummy gate electrode layer 109 are deposited independently and then may be patterned together using photolithography and etching processes to from the dummy gate structures 120 and 130. The deposition processes for the dummy gate dielectric layer 108 and the dummy gate electrode layer 109 may include CVD, PVD, ALD, high density plasma CVD (HDPCVD), metal organic CVD (MOCVD), or plasma enhanced CVD (PECVD) process. The etching processes for forming the dummy gate structures 120 and 130 may include RIE, NBE or another suitable etching process.

A first hard mask 117 and a second hard mask 118 are patterned and formed on the dummy gate electrode layer 109 to serve as an etching mask for forming the dummy gate structures 120 and 130. In some examples, the first hard mask 117 is made of silicon carbon nitride (SiCN), silicon oxycarbide (SiOC), silicon oxycarbon nitride (SiOCN) or silicon nitride (SiN or $Si_3N_4$). The second hard mask 118 may be made of silicon oxide ($SiO_2$). The first hard mask 117 and the second hard mask 118 are formed using deposition, photolithography and etching processes.

Figure 3A:
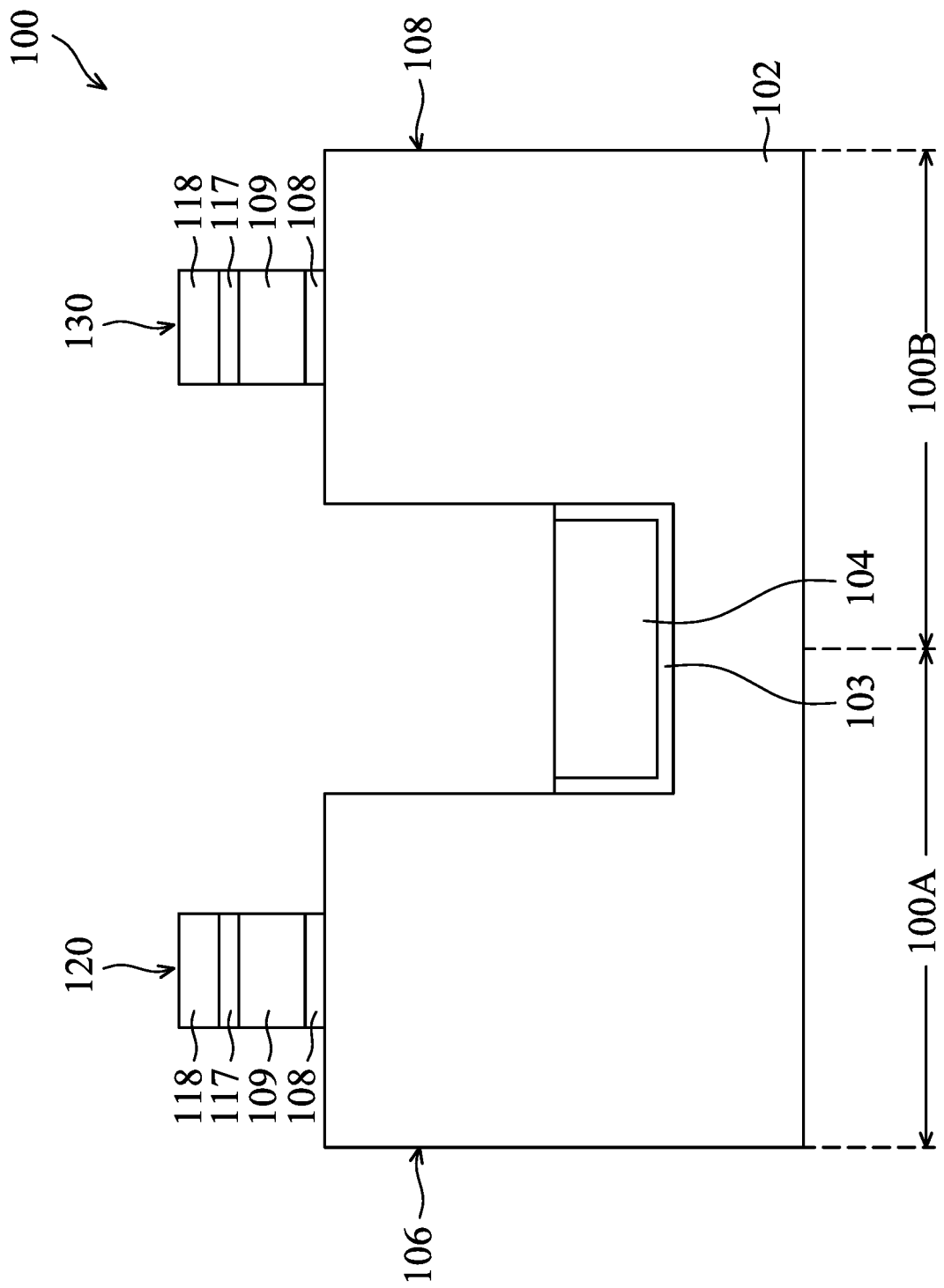
FIGS. 3A to 3Q show cross-sectional views of respective structures at various stages of an exemplary method for fabricating a semiconductor device taken along line I-I' in FIG. 1, in accordance with some embodiments.
Figure 3B:
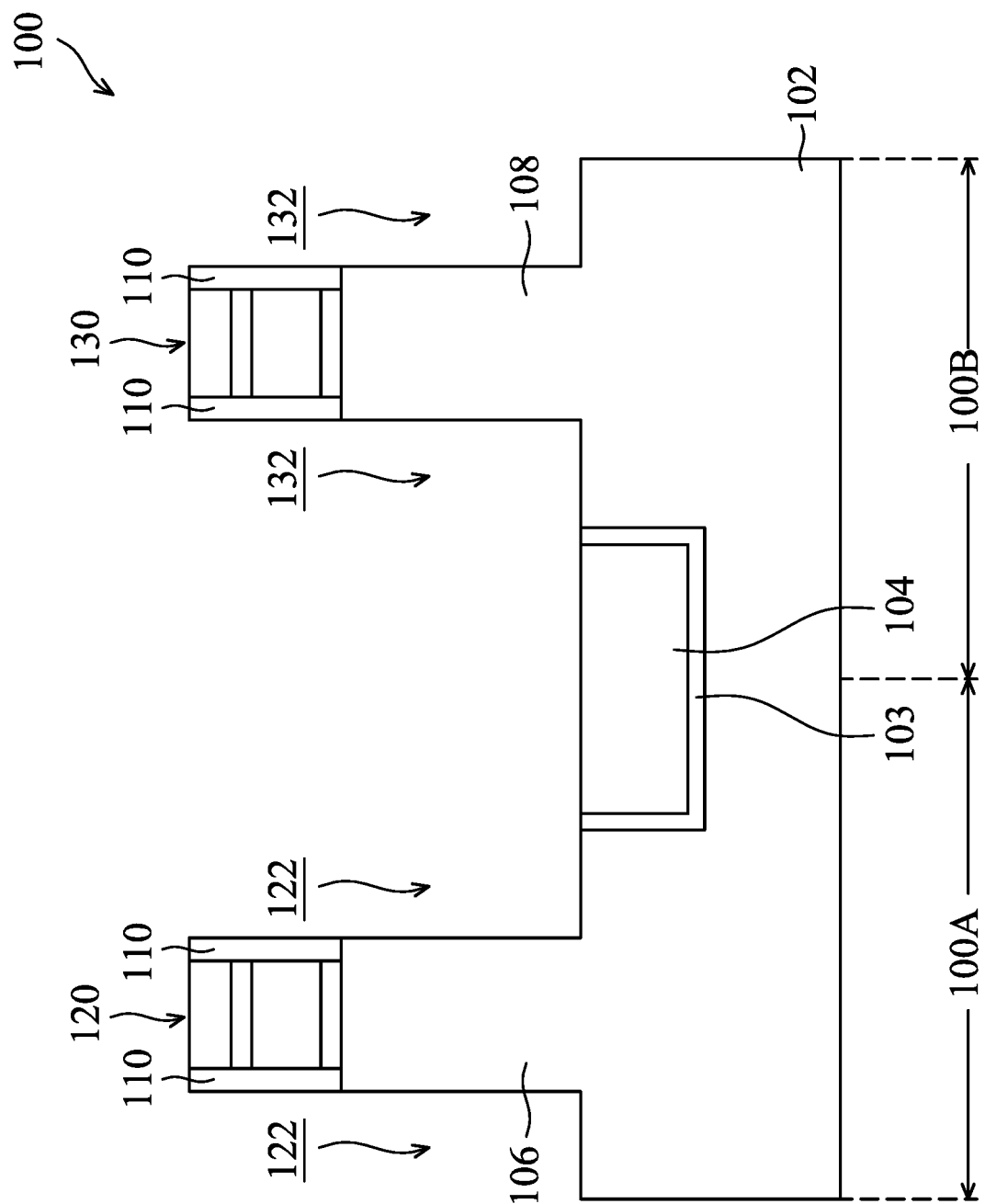
Figure 3C:
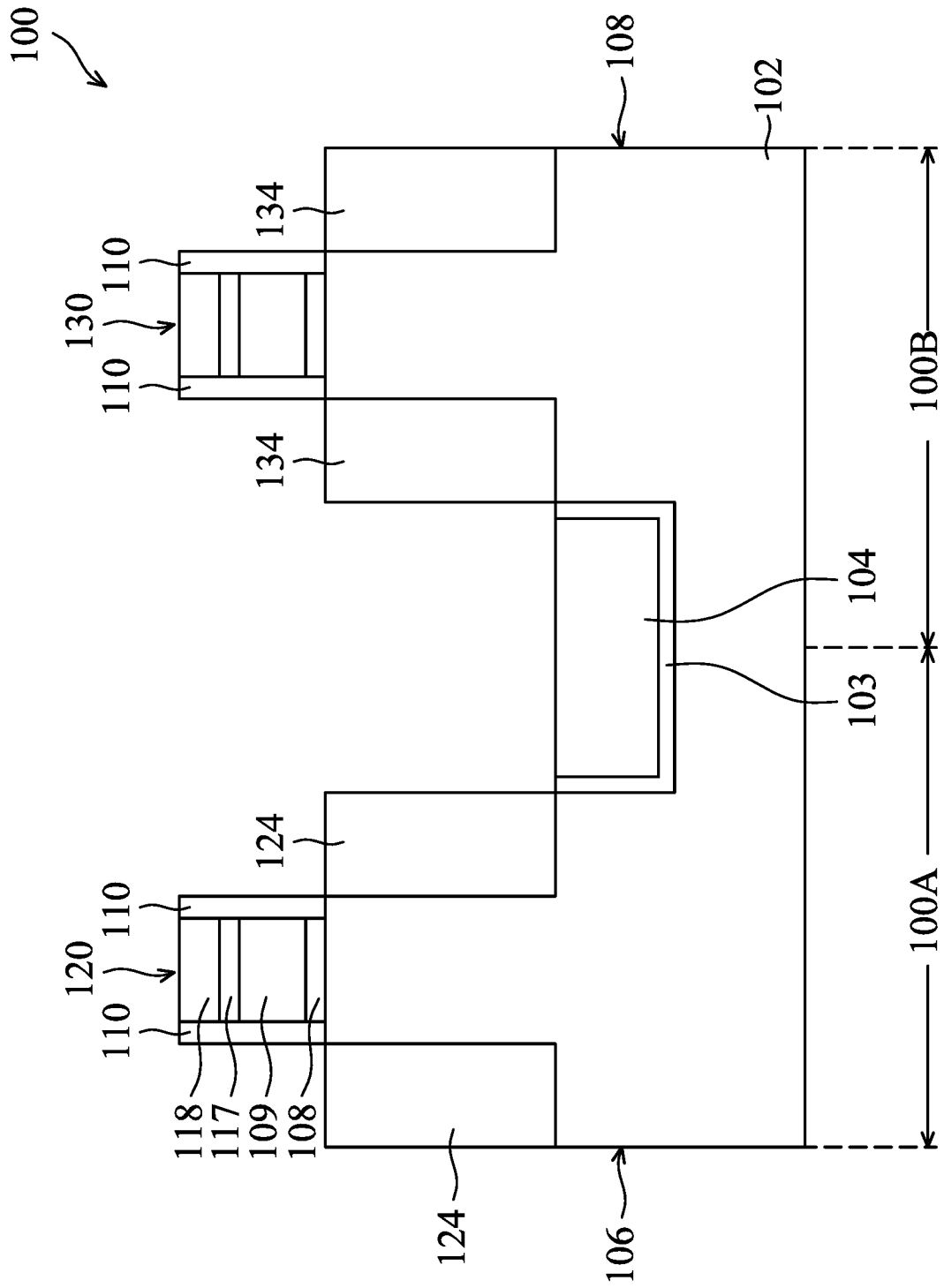
Figure 3D:
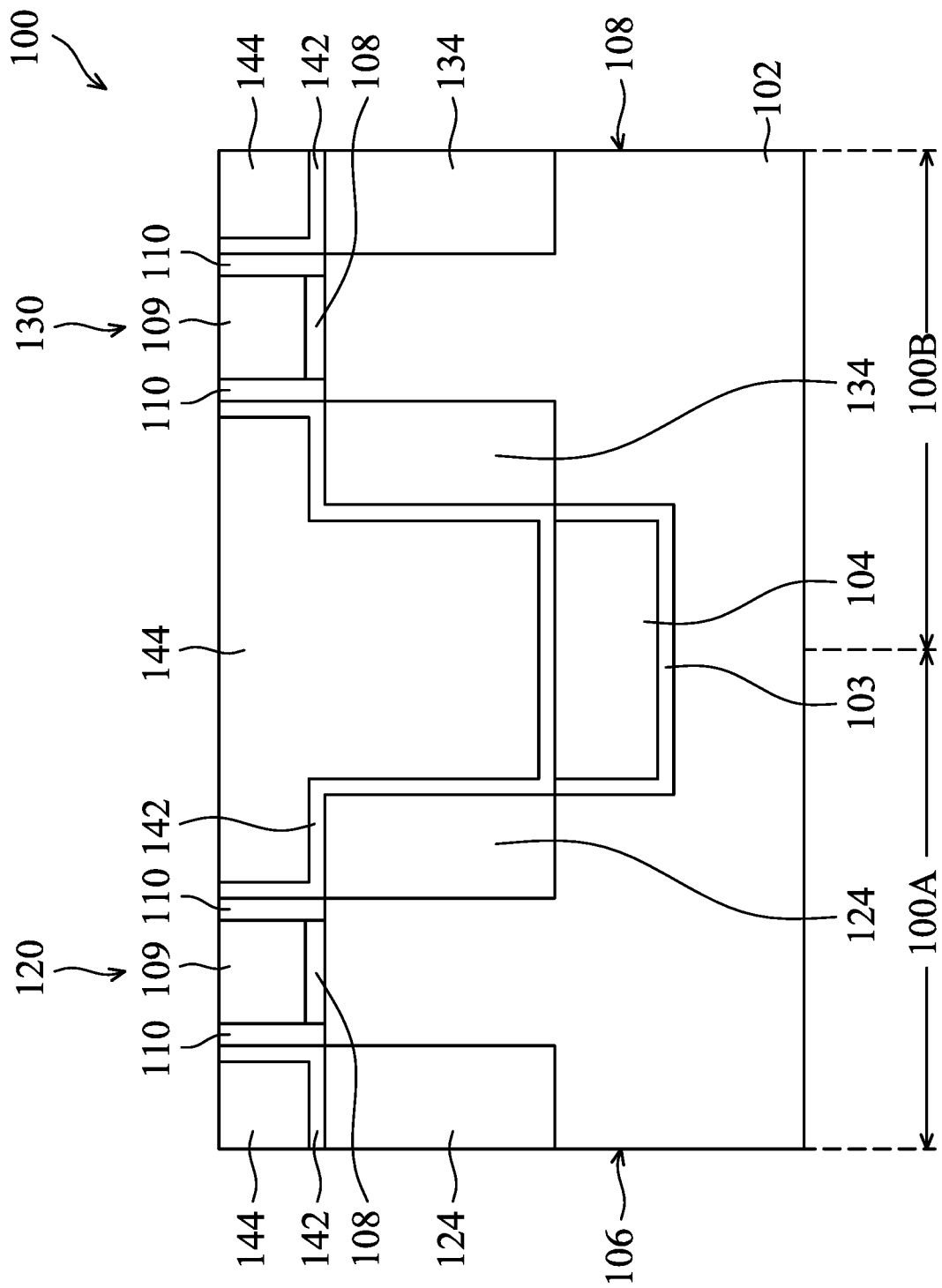
Figure 3E:
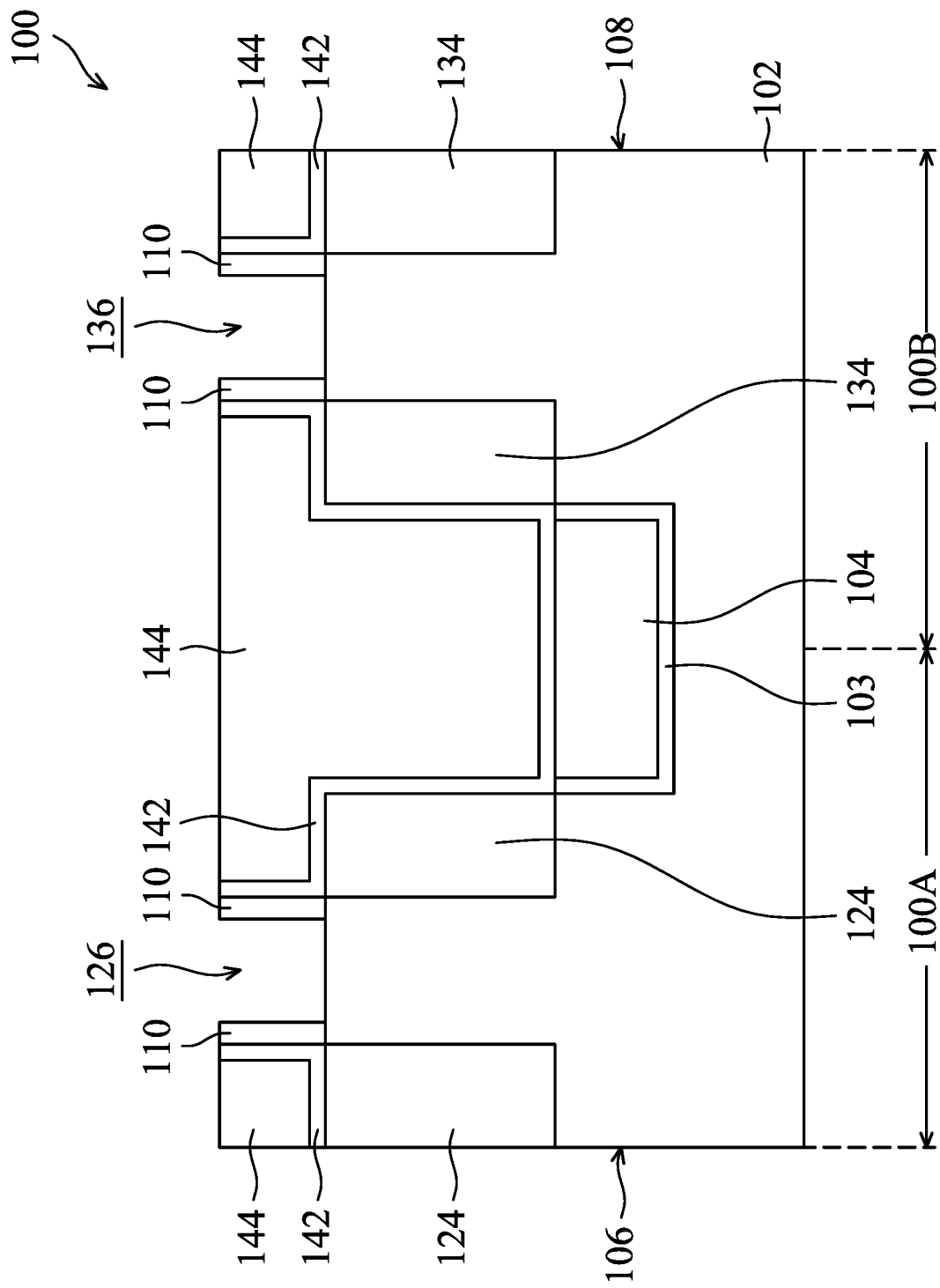
Figure 3F:
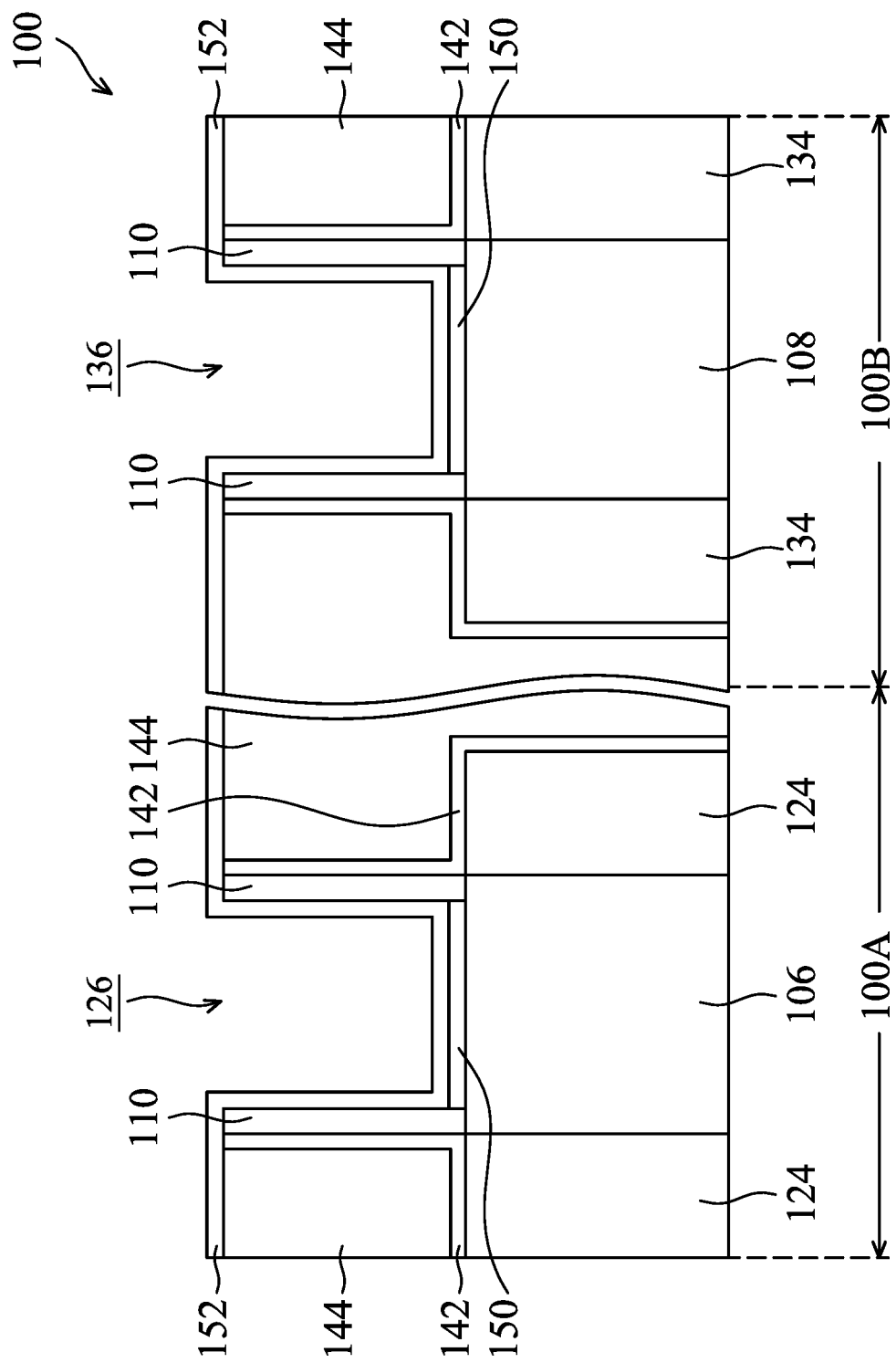
Figure 3G:
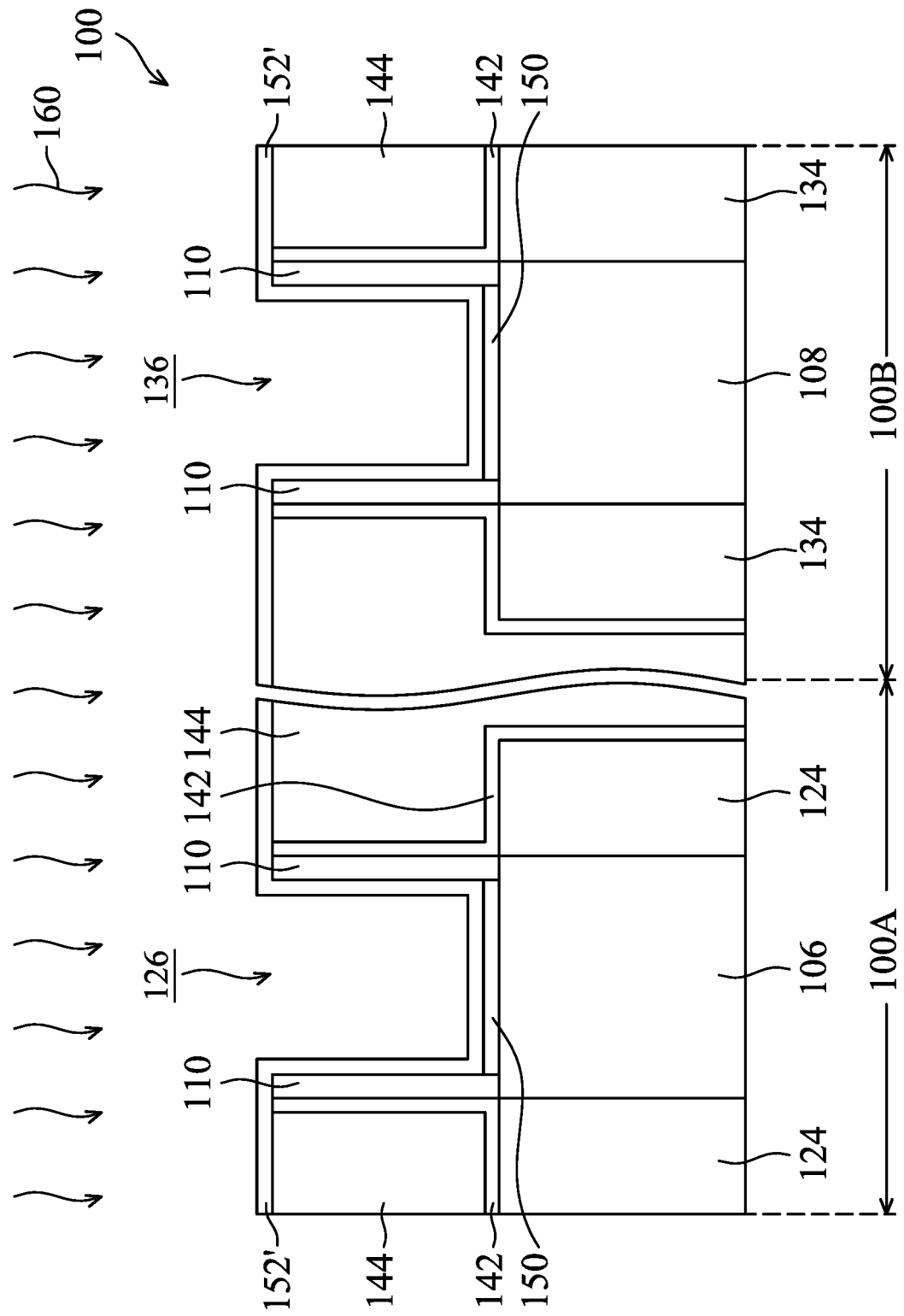
Figure 3H:
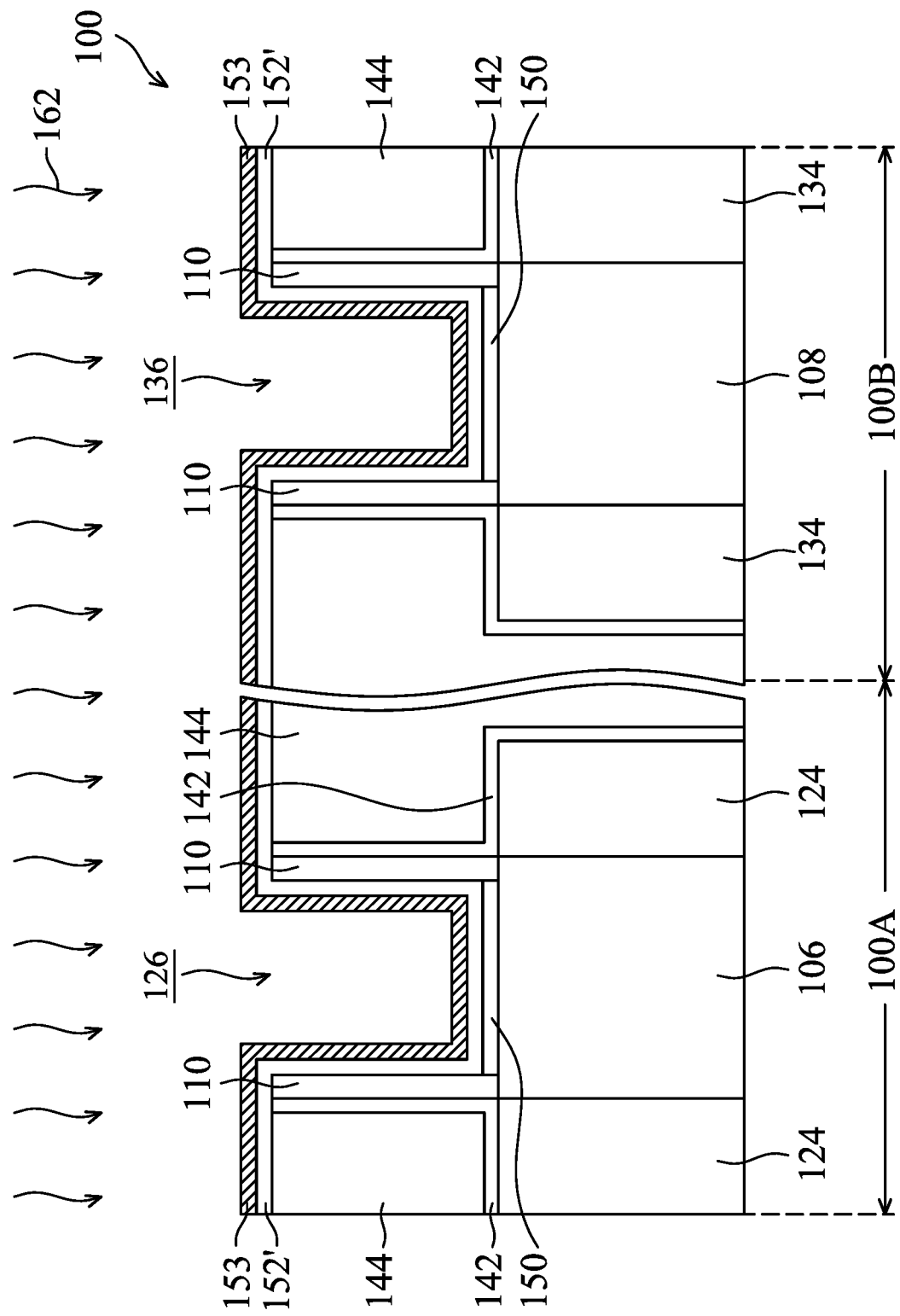
Figure 3I:
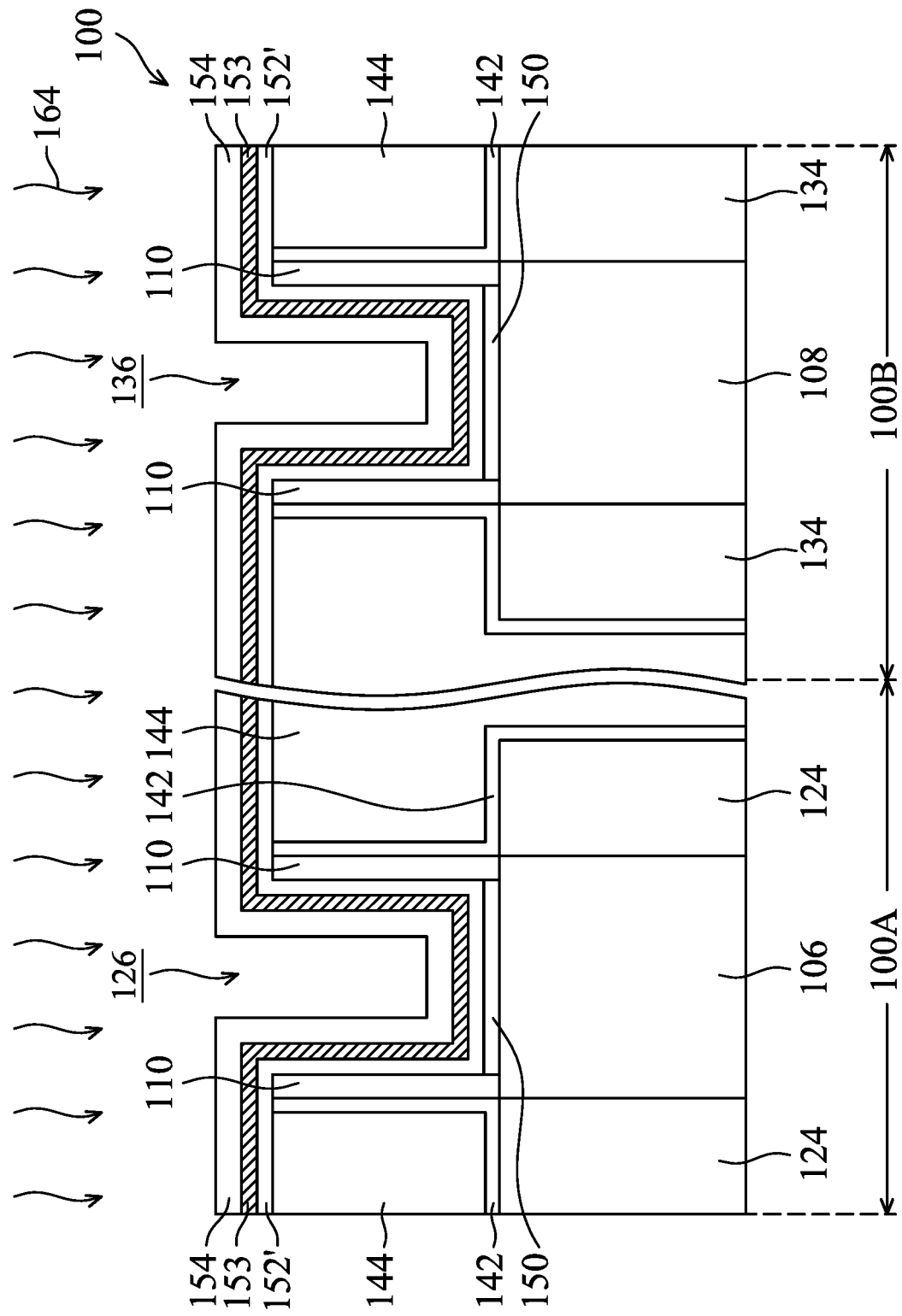
Figure 3J:
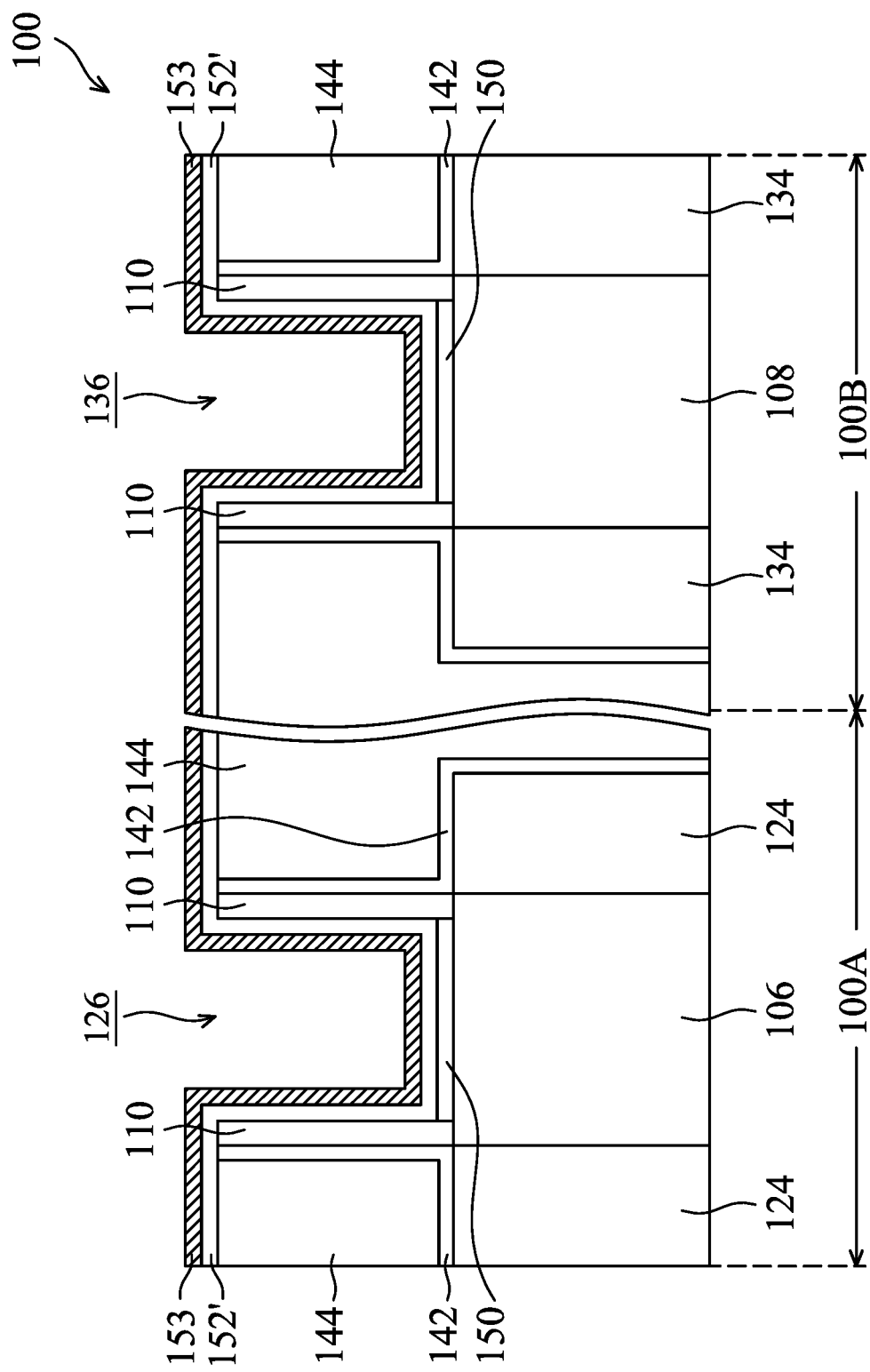
Figure 3K:
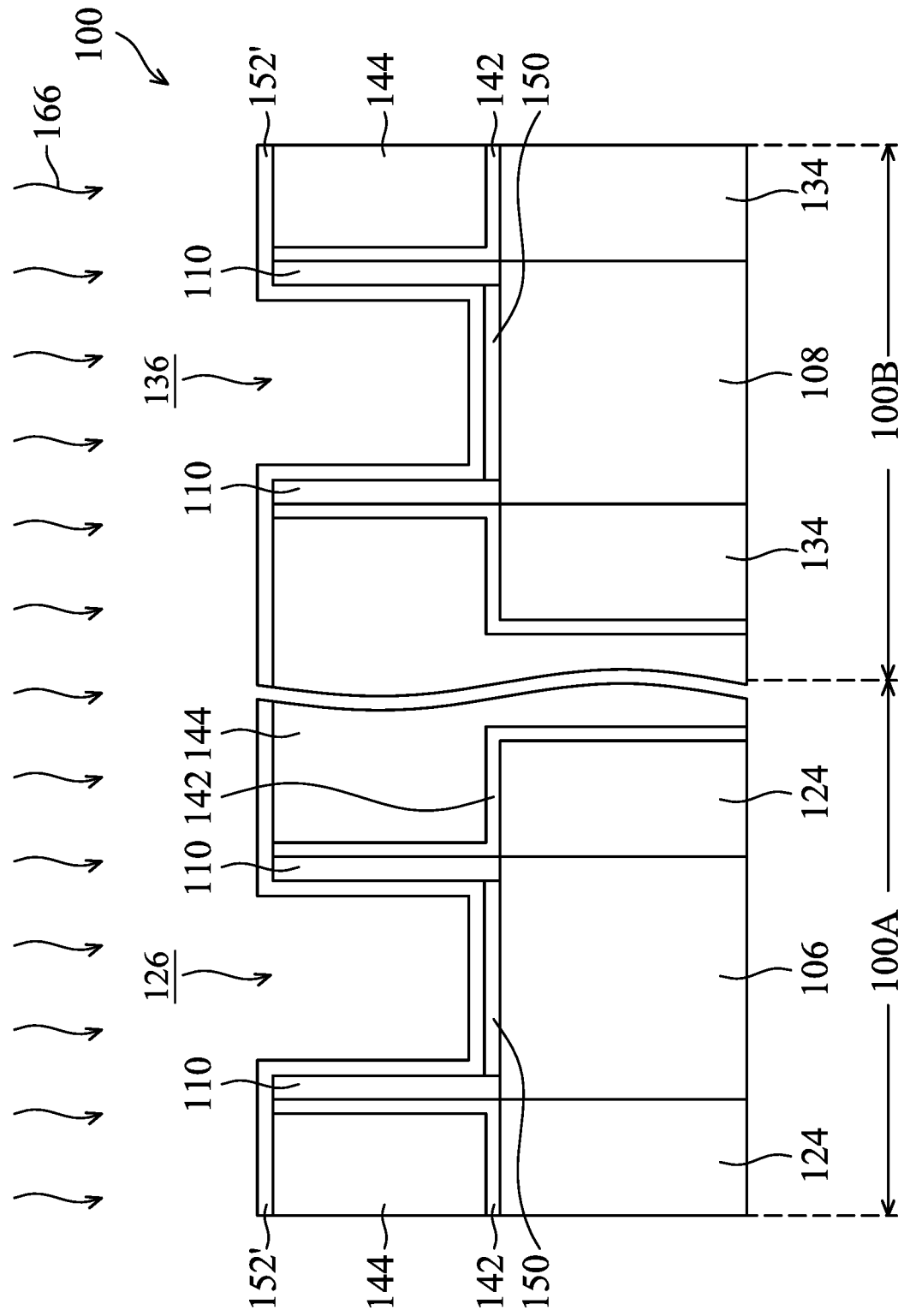
Figure 3L:
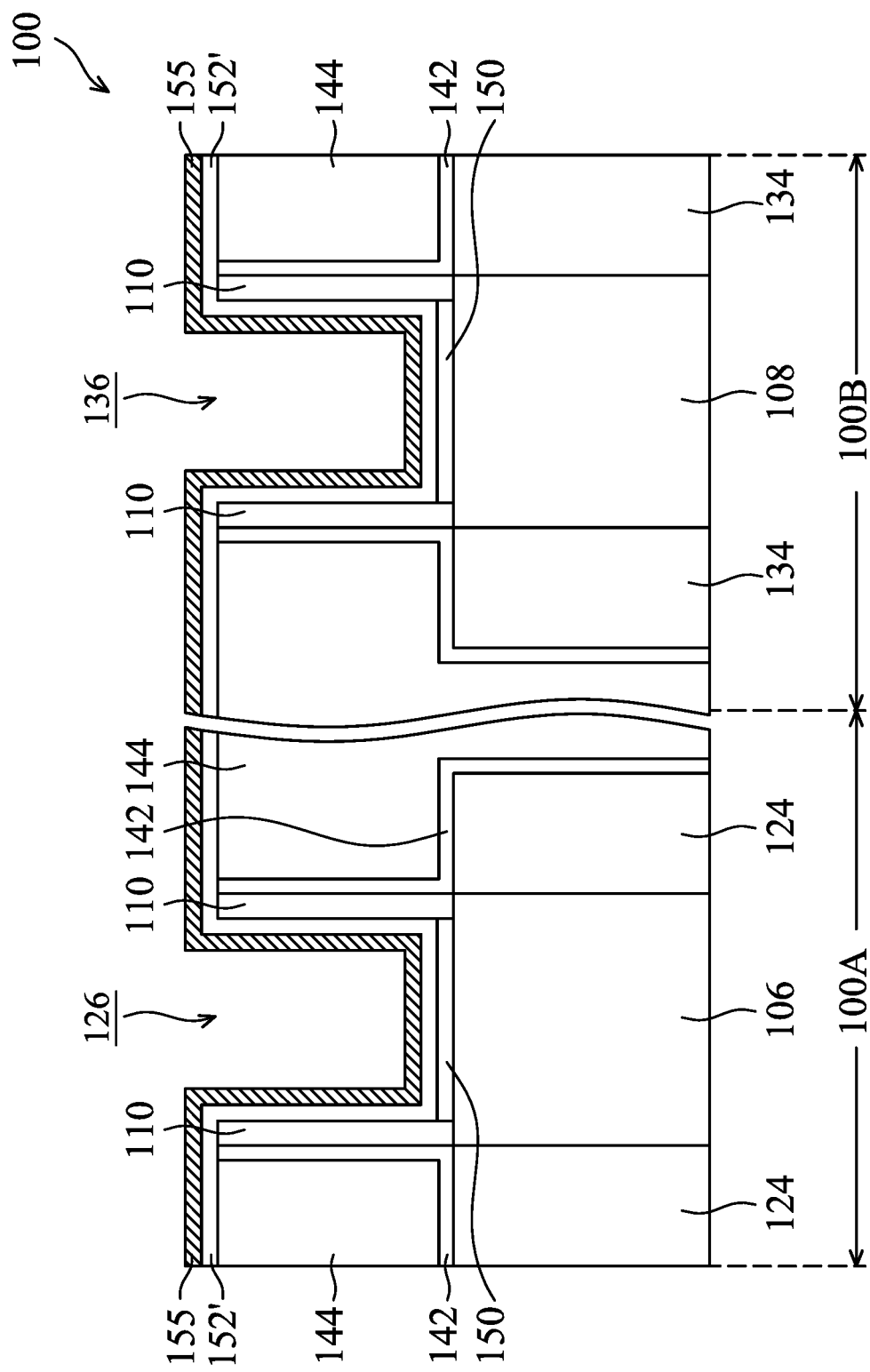
Figure 3M:
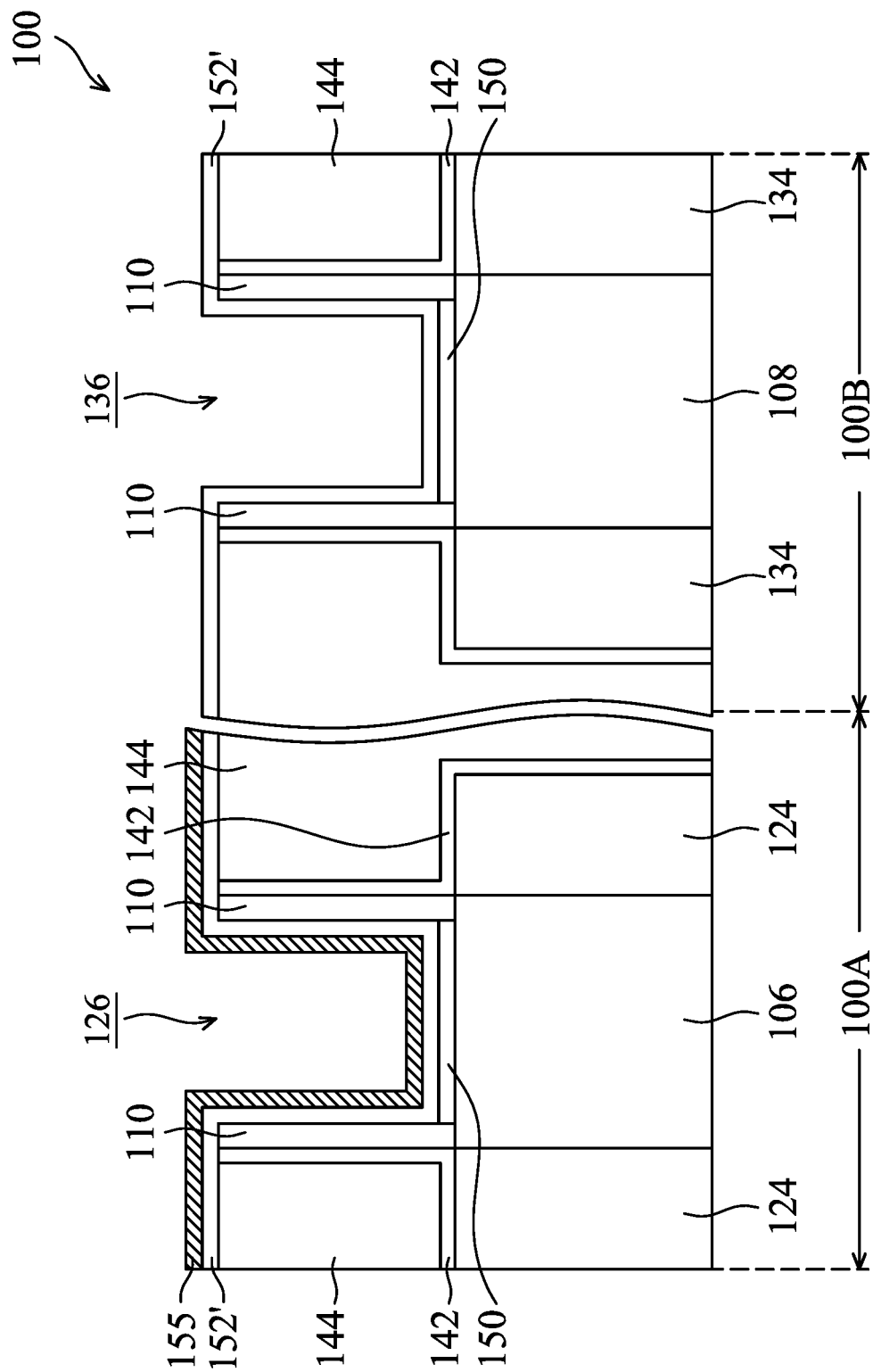
Figure 3N:
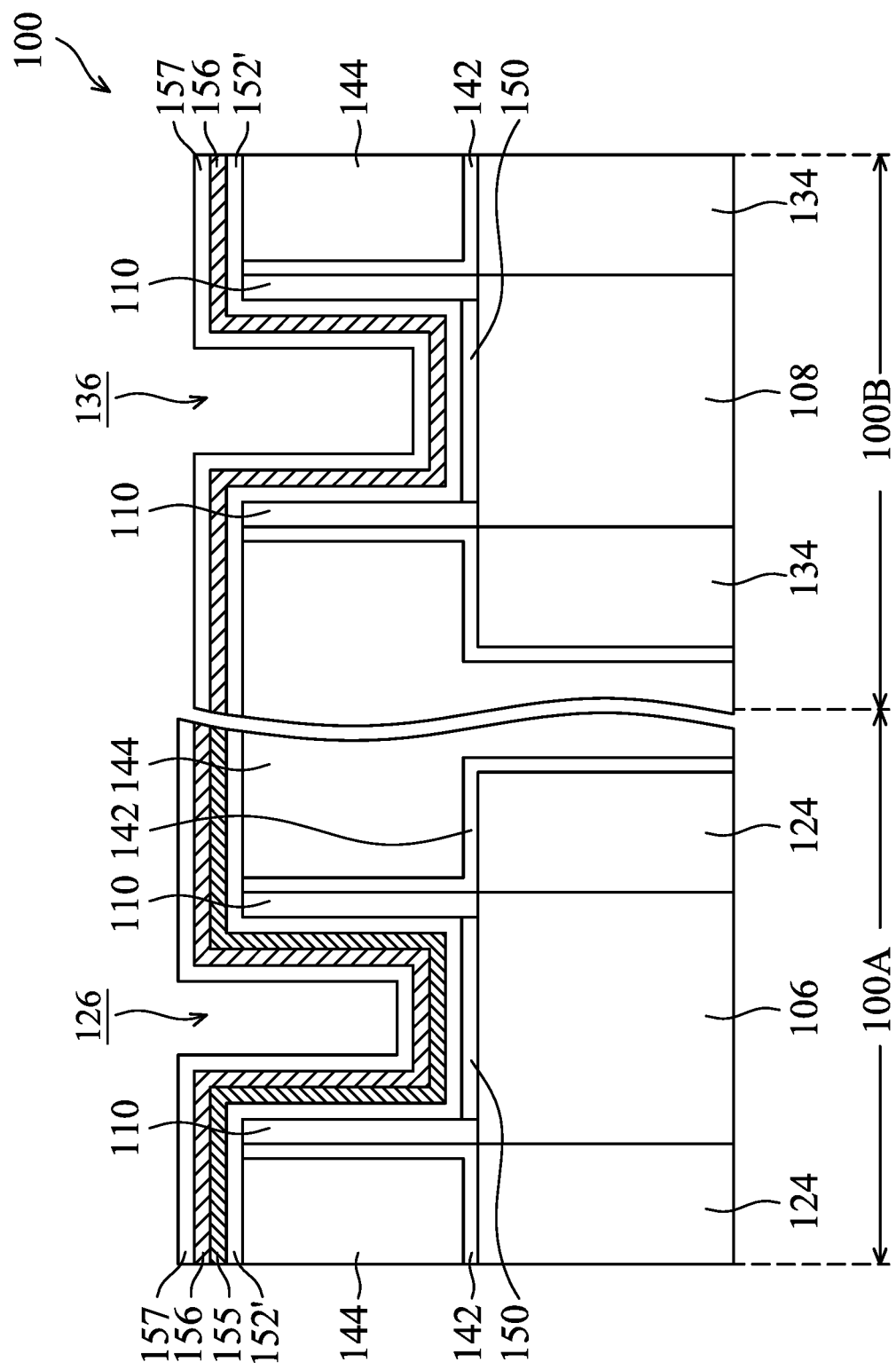
Figure 3O:
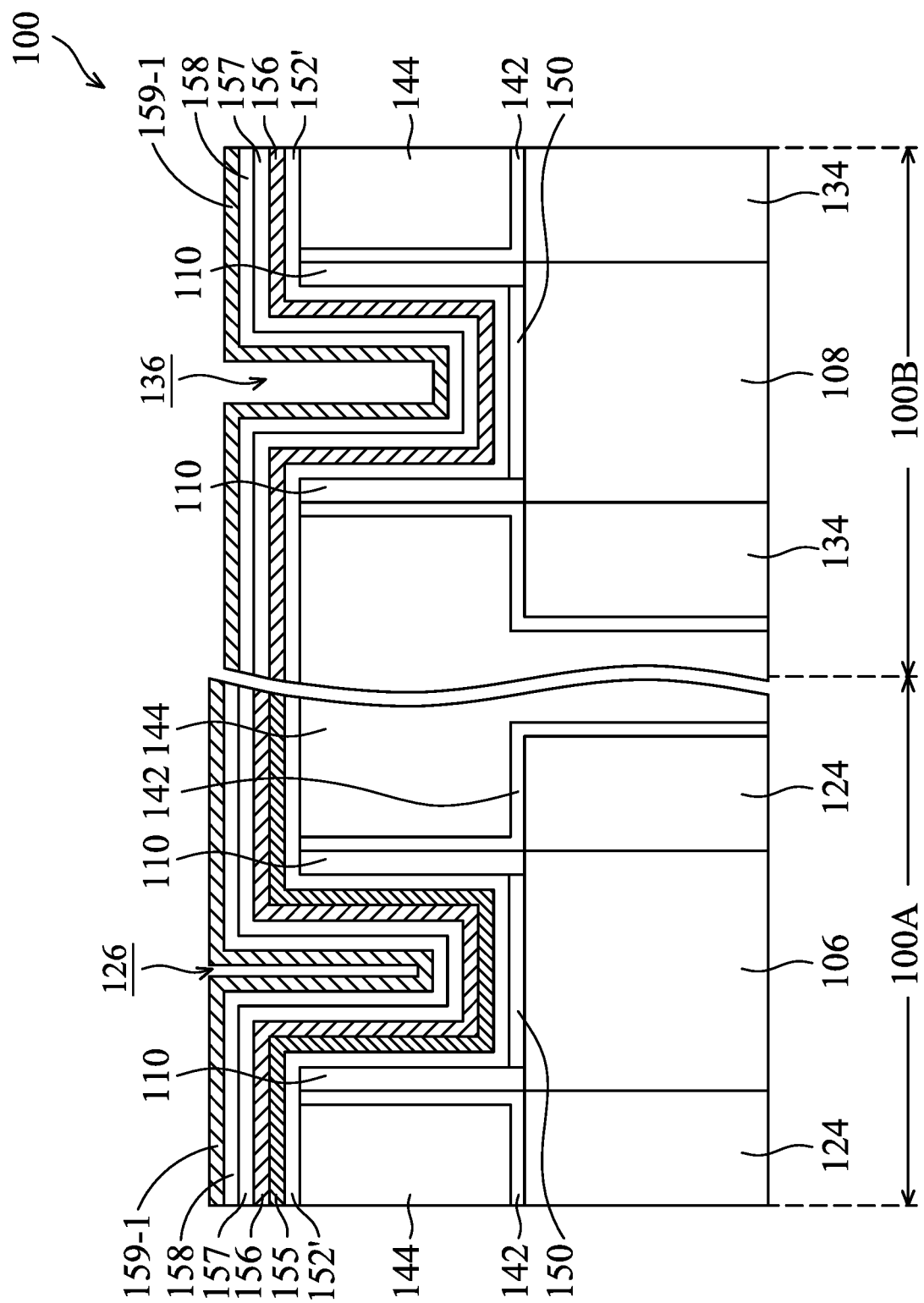
Figure 3P:
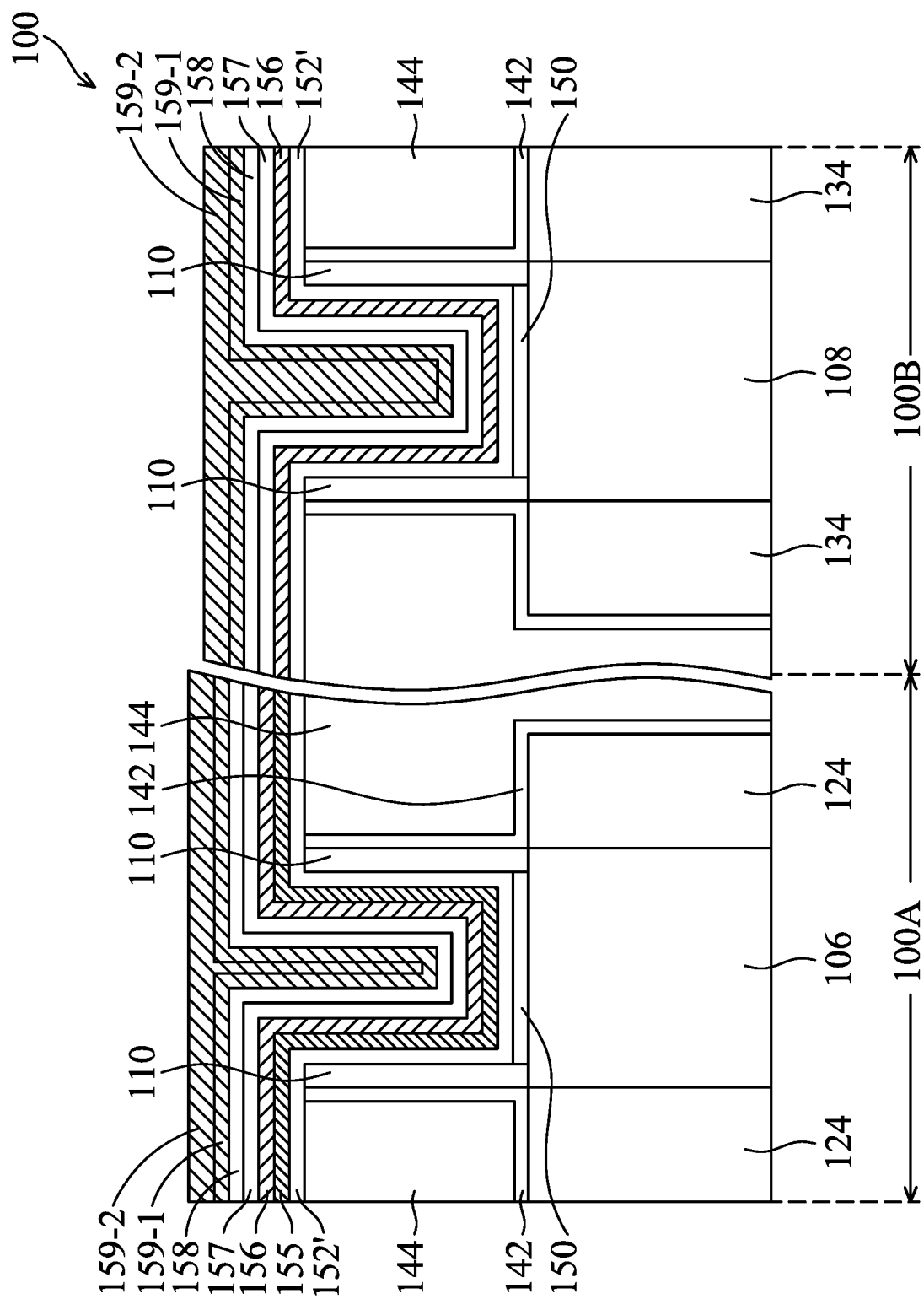
Figure 3Q:
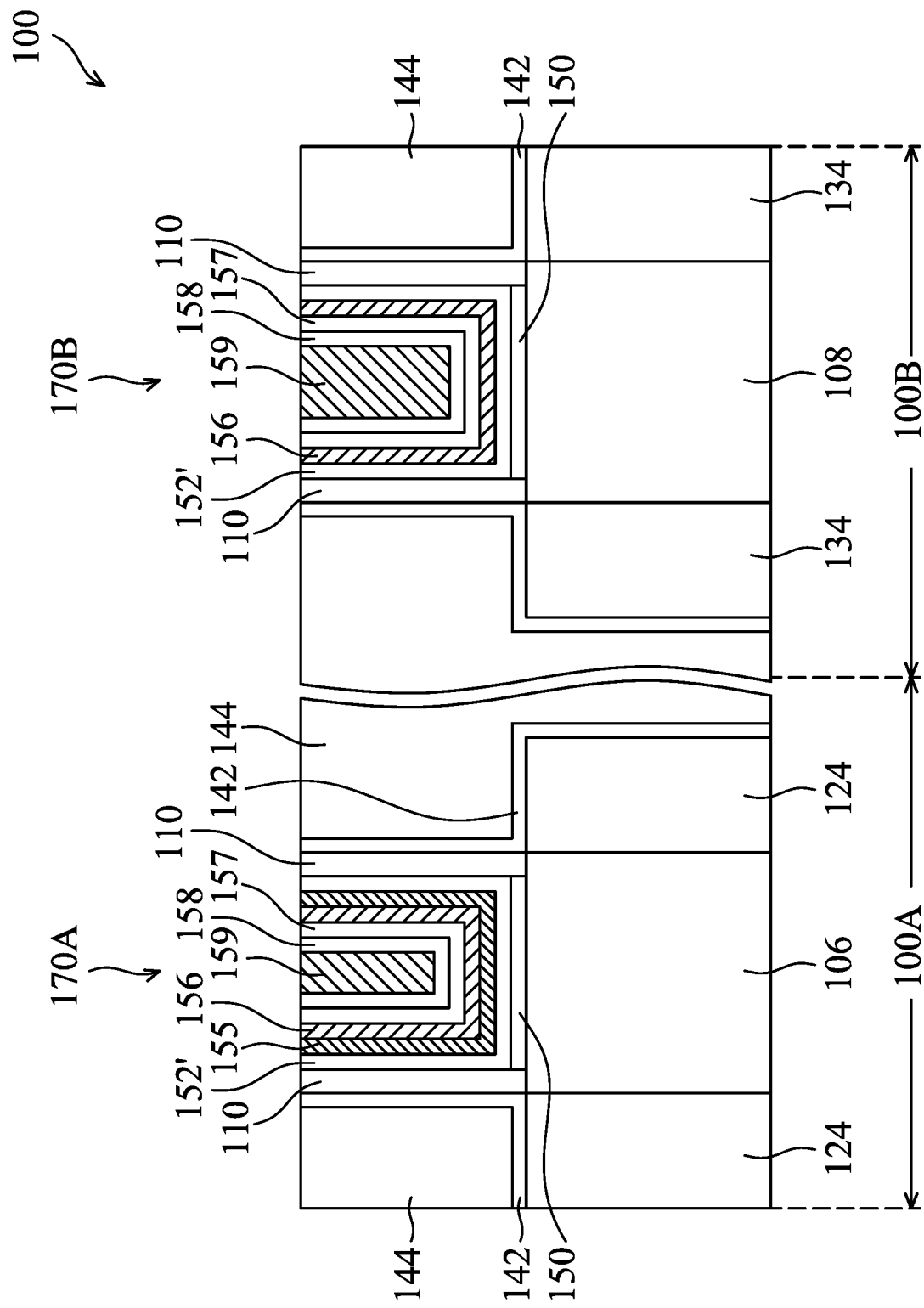

FIGS. 3A to 3Q show cross-sectional views of respective structures at various stages of an exemplary method for fabricating the semiconductor device 100 taken along line I-I' in FIG. 1, in accordance with some embodiments. Line I-I' is on a plane that is perpendicular to the dummy gate structures 120 and 130, and along the fins 106 and 108. Referring to FIG. 3A, the dummy gate structure 120 is formed on the fin 106, and the dummy gate structure 130 is formed on the fin 108, in accordance with some embodiments. The various features as shown in FIG. 3A are the same as or similar to those described with respect to FIGS. 1 and 2.

Next, referring to FIG. 3B, gate spacers 110 are formed along the sidewalls of the dummy gate structures 120 and 130, in accordance with some embodiments. The gate spacers 110 may be formed by conformally depositing one or more spacer material layers on and along the sidewalls of the dummy gate structures 120 and 130, and on the isolation structures 104. The spacer material layers are also conformally deposited on the top surfaces and the sidewalls of the fins 106 and the fins 108. The spacer material layers may be made of different materials and have different thicknesses than each other. The one or more spacer material layers may include silicon oxide ($SiO_2$), silicon nitride (SiN or $Si_3N_4$), silicon oxynitride (SiON), silicon carbon nitride (SiCN), or a combination thereof, and may be deposited by CVD, ALD or another deposition process. The spacer material layers are then anisotropically etched to form the gate spacers 110 on the sidewalls of the dummy gate structures 120 and 130. The etching process may include a RIE, NBE, or another etching process.

Afterwards, portions of the fin 106 at source and drain regions are etched using the dummy gate structure 120 and the gate spacers 110 as etching mask to form recesses 122 in the fin 106. Also, portions of the fin 108 at source and drain regions are etched using the dummy gate structure 130 and the gate spacers 110 as etching mask to form recesses 132 in the fin 108. The recesses 122 and 132 may be formed using an isotropic etching process such as plasma etching, RIE or another dry etching process. Alternatively, the isotropic etching process may be a wet etching process that uses an etching solution such as ammonium hydroxide-peroxide water mixture (APM), tetramethylammonium hydroxide (TMAH), ammonium hydroxide ($NH_4OH$), or another etchant. The bottom surfaces of the recesses 122 and 132 are lower than the top surface of the fins 106 and 108. Moreover, the bottom surfaces of the recesses 122 and 132 may be at the same level with or lower than the top surfaces of the isolation structure 104 and the liner 103.

Next, referring to FIG. 3C, source and drain structures 124 are formed in the recesses 122 and on opposite sides of the dummy gate structure 120 in the pMOS region 100A, in accordance with some embodiments. Also, source and drain structures 134 are formed in the recesses 132 and on opposite sides of the dummy gate structure 130 in the nMOS region 100B. The source and drain structures 124 in the pMOS region 100A and the source and drain structures 134 in the nMOS region 100B may be independently formed by epitaxial growth processes with different epitaxial semiconductor materials. The epitaxial semiconductor materials include silicon germanium ($SiGe1-x$, where x can be between approximately 0 and 1), silicon carbide (SiC), silicon phosphorus, germanium, an III-V compound semiconductor, an II-VI compound semiconductor, or another epitaxial semiconductor. The materials of an III-V compound semiconductor may include InAs, AlAs, GaAs, InP, GaN, InGaAs, InAlAs, GaSb, AlSb, AlP or GaP. In some examples, the source and drain structures 124 in the pMOS region 100A are made of SiGe, and the source and drain structures 134 in the nMOS region 100B are made of SiC.

The source and drain structures 124 and the source and drain structures 134 may be independently formed by metalorganic CVD (MOCVD), molecular beam epitaxy (MBE), liquid phase epitaxy (LPE), vapor phase epitaxy (VPE), selective epitaxial growth (SEG), or a combination thereof. In addition, the source and drain structures 124 and the source and drain structures 134 may be independently doped by in-situ doping during the epitaxial growth processes and/or by implantation after the epitaxial growth processes.

Figure 4:
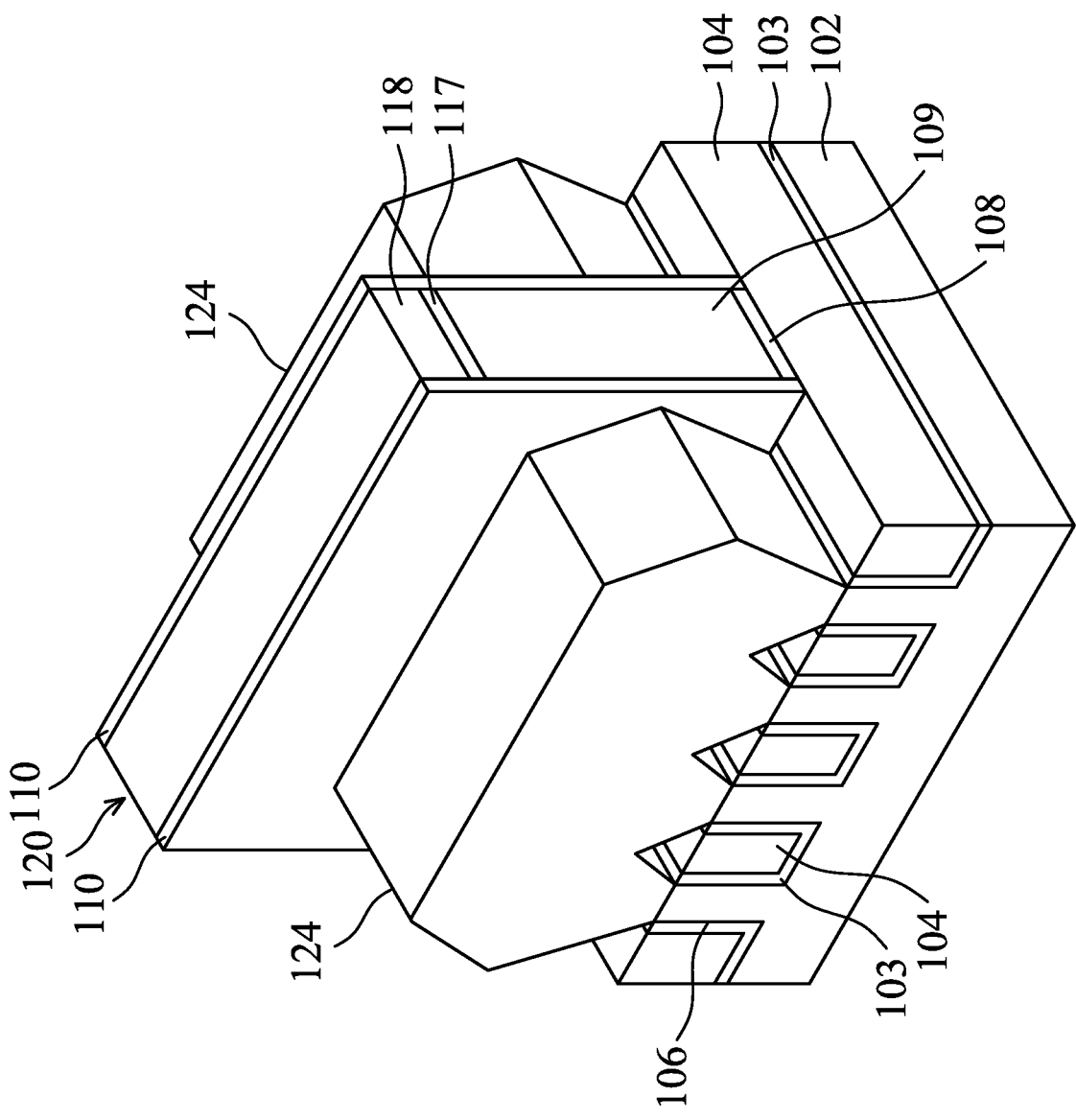
FIG. 4 shows a perspective view of an intermediate structure at one stage of an exemplary method for fabricating a semiconductor device, in accordance with some embodiments.

FIG. 4 illustrates a perspective (three-dimensional) view of an intermediate structure at one stage of an exemplary method for fabricating the semiconductor device 100, in accordance with some embodiments. The structure of FIG. 4 illustrates a portion of the semiconductor device 100 in the pMOS region 100A after the source and drain structures 124 are formed. Another portion of the semiconductor device 100 in the nMOS region 100B may also have the same perspective view as shown in FIG. 4. In some embodiments, the source and drain structures 124 in the pMOS region 100A may be shared between two neighboring transistors, such as through coalescing the structures by epitaxial growth. For example, the neighboring FinFETs with the shared source and drain structures 124 may be implemented as four functional transistors. Other configurations in other examples may implement other numbers of functional transistors. As shown in FIG. 4, the source structures 124 on four neighboring fins 106 are merged together into one epitaxial source structure, in accordance with some embodiments. Also, the drain structures 124 on four neighboring fins 106 are merged together into one epitaxial drain structure. In some instances, the top surfaces of the epitaxial source and drain structures 124 and 134 may be higher than or at the same level with the top surfaces of portions of the fins 106 and 108 under the dummy gate structures 120 and 130, respectively. In some embodiments, the source and drain structures 124 on four neighboring fins 106 may be separated from each other. The source and drain structures 134 on four neighboring fins 108 may also be separated from each other.

Next, referring to FIG. 3D, a contact etch stop layer (CESL) 142 and an interlayer dielectric (ILD) layer 144 are formed on the source and drain structures 124, the source and drain structures 134 and the isolation structure 104, in accordance with some embodiments. The CESL 142 is conformally deposited on the dummy gate structures 120 and 130, the gate spacers 110, the source and drain structures 124, the source and drain structures 134, and the isolation structure 104. The ILD layer 144 is deposited on the CESL 142.

Generally, the CESL 142 can provide a mechanism to stop an etching process when forming via contacts to the source and drain structures 124 and 134. The CESL 142 may be formed of a dielectric material having a different etch selectivity from the adjacent ILD layer 144. The material of the CESL 142 may include silicon nitride (SiN or $Si_3N_4$), silicon carbon nitride (SiCN) or a combination thereof, and may be deposited by CVD, PECVD, ALD, or another deposition process. In some examples, the CESL 142 has a thickness in a range from about 2 nm to about 5 nm. The material of the ILD layer 144 may include silicon dioxide or a low-k dielectric material (e.g., a material having a dielectric constant (k-value) lower than the k-value (about 3.9) of silicon dioxide). The low-k dielectric material may include silicon oxynitride, phosphosilicate glass (PSG), borosilicate glass (BSG), borophosphosilicate glass (BPSG), undoped silicate glass (USG), fluorinated silicate glass (FSG), silicon oxycarbide (SiOxCy), Spin-On-Glass (SOG) or a combination thereof. The ILD layer 144 may be deposited by spin-on coating, CVD, Flowable CVD (FCVD), PECVD, PVD, or another deposition process.

Afterwards, a planarization process, for example a chemical mechanical polishing (CMP) process, is performed on the ILD layer 144 and the CESL 142. The first hard masks 117, the second hard masks 118 and portions of the gate spacers 110 are also removed in the planarization process. After the planarization process, the dummy gate electrode layers 109 are exposed. The top surfaces of the ILD layer 144 and the CESL 142 may be coplanar with the top surfaces of the dummy gate electrode layers 109 and the gate spacers 110.

Referring to FIG. 3E, the dummy gate electrode layers 109 and the dummy gate dielectric layers 108 are removed using one or more etching processes, in accordance with some embodiments. Thereafter, in the pMOS region 100A, a trench 126 is formed between the gate spacers 110. Also, in the nMOS region 100B, a trench 136 is formed between the gate spacers 110.

Next, FIGS. 3F to 3Q show cross-sectional views of a portion of respective structures at various stages of an exemplary method for fabricating the semiconductor device 100 taken along line I-I' in FIG. 1, in accordance with some embodiments. In the cross-sectional views of FIGS. 3F to 3Q, the dimensions of various features may not be drawn to scale and may be arbitrarily increased or reduced for clarity of illustration.

Referring to FIG. 3F, an interfacial layer (IL) 150 is formed on the fins 106 and 108 in the trenches 126 and 136, in accordance with some embodiments. The interfacial layer 150 may be silicon oxide and formed by deposition, chemical oxidation or thermal oxidation process. In some embodiments, the interfacial layer 150 is silicon dioxide ($SiO_2$) which is formed using ozone ($O_3$) with standard clean 1 (SC1) and standard clean 2 (SC2) processes. The interfacial layer 150 may be referred to as chemical interfacial layer. In some examples, the interfacial layer 150 has a thickness that is in a range from about 5 Å to about 15 Å.

Afterwards, an amorphous gate dielectric layer 152 is conformally deposited on the ILD layer 144, the CESL 142, the gate spacers 110 and the interfacial layer (IL) 150, in the trenches 126 and 136. In some embodiments, the amorphous gate dielectric layer 152 is made of a high-k dielectric material. The high-k dielectric material may have a k-value greater than about 7.0. The high-k dielectric material may include a metal oxide of or a metal silicate of Hf, Al, Zr, La, Mg, Ba, Ti, Ta, Pr, Pb, Y, or a combination thereof, such as $HfO_2$, $Al_2O_3$, $ZrO_2$, $La_2O_3$, BaO, $TiO_2$, $Ta_2O_5$, $Pr_2O_3$ or $Y_2O_3$. The amorphous gate dielectric layer 152 may be referred to as an amorphous high-k gate dielectric layer. The amorphous gate dielectric layer 152 may be deposited by ALD, PECVD, molecular-beam deposition (MBD), or another deposition process. In some embodiments, the amorphous gate dielectric layer 152 is $HfO_2$ that is deposited by ALD process using $HfCl_4$ and $H_2O$ as precursor. The process temperature of the ALD process is in a range from about 250° C. to about 350° C. The total pressure of the ALD process is in a range from about 3 torr to about 30 torr. In some examples, the amorphous gate dielectric layer 152 has a thickness that is in a range from about 10 Å to about 20 Å.

Next, referring to FIG. 3G, an ex-situ or in-situ first post deposition annealing (PDA) process 160 is performed on the amorphous gate dielectric layer 152 in the pMOS region 100A and the nMOS region 100B to form a crystalline high-k gate dielectric layer 152', in accordance with some embodiments. The ex-situ first PDA process 160 is performed in a process chamber that is different from the process chamber for depositing the amorphous gate dielectric layer 152. The in-situ first PDA process 160 is performed in the same process chamber as that for depositing the amorphous gate dielectric layer 152. The first PDA process 160 can crystallize the amorphous gate dielectric layer 152 into the crystalline high-k gate dielectric layer 152'. In some embodiments, the first PDA process 160 includes a soak annealing followed by a flash annealing. The soak annealing may be performed at a temperature in a range from about 550° C. to about 650° C. with a soak time in a range from about 10 seconds to about 60 seconds. The flash annealing may be performed at a temperature in a range from about 950° C. to about 1150° C. with a flash time of about 1.4 milliseconds (ms), and at a process pressure in a range from about 30 torr to about 50 torr.

In some embodiments, the first PDA process 160 is performed in an $NH_3$-containing ambience that includes $N_2$ and $NH_3$. The ratio of $NH_3$ in total volume may be equal to or below about 10%. In some examples, the ratio of $NH_3$ is about 10% or about 1%. In some examples, the first PDA process 160 is performed in a $N_2$ ambience of about 100% $N_2$. In some other examples, the first PDA process 160 is performed in an $NH_3$ ambience of about 100% $NH_3$.

Next, referring to FIG. 3H, a first capping layer 153 is conformally deposited on the crystalline high-k gate dielectric layer 152' in the pMOS region 100A and the nMOS region 100B, in accordance with some embodiments. The first capping layer 153 is made of a metal-containing material and includes TiN, TaN, TiSiN, TaSiN, TiAlN, TaAlN, TiCN, TaCN or AlN. In some examples, the first capping layer 153 is TiN that is deposited by ALD process using $TiCl_4$ and $NH_3$ as precursor. In some examples, the first capping layer 153 is TiSiN that is deposited by ALD process using $TiCl_4$, $SiH_4$ and $NH_3$ as precursor. The ALD process may be ex-situ performed in a process chamber that is different from the process chamber for depositing the amorphous gate dielectric layer 152. Alternatively, the ALD process may be in-situ performed in a process chamber that is the same as the process chamber for depositing the amorphous gate dielectric layer 152. The first capping layer 153 has a thickness that may be in a range from about 10 Å to about 20 Å.

Afterwards, a post metal annealing (PMA) process 162 is performed on the first capping layer 153 in the pMOS region 100A and the nMOS region 100B to reduce oxygen vacancy in the crystalline high-k gate dielectric layer 152'. The PMA process 162 may be ex-situ performed in a process chamber that is different from the process chamber for depositing the first capping layer 153. Alternatively, the PMA process 162 may be in-situ performed in the same process chamber as that for depositing the first capping layer 153. The PMA process may be performed at a temperature in a range from about 850° C. to about 950° C. with spike annealing in an $N_2$ ambience.

Next, referring to FIG. 3I, a second capping layer 154 is conformally deposited on the first capping layer 153 in the pMOS region 100A and the nMOS region 100B, in accordance with some embodiments. In some examples, the second capping layer 154 is silicon (Si) that is deposited by CVD process using $Si_2H_6$ and $H_2$ as precursor at a temperature in a range from about 350° C. to about 450° C. The CVD process is ex-situ performed in a process chamber that is different from the process chamber for depositing the first capping layer 153. The second capping layer 154 has a thickness that may be in a range from about 20 Å to about 50 Å.

Afterwards, an post-cap anneal (PCA) process 164 is performed on the second capping layer 154 in the pMOS region 100A and the nMOS region 100B to enhance the film quality of the crystalline high-k gate dielectric layer 152'. The PCA process 164 may be ex-situ performed in a process chamber that is different from the process chamber for depositing the second capping layer 154. Alternatively, the PCA process 164 may be in-situ performed in the same process chamber as that for depositing the second capping layer 154. The PCA process 164 may be performed at a temperature in a range from about 900° C. to about 950° C. with spike annealing in an $N_2$ ambience.

Next, referring to FIG. 3J, the second capping layer 154 is removed by a dry etching process and a wet etching process, in accordance with some embodiments. The dry etching process may be reactive ion etch (RIE) process using sulfur hexafluoride ($SF_6$) and chlorine ($Cl_2$) as etching gas. The wet etching process may use mixture of ammonium hydroxide ($NH_4OH$) and hydrofluoric acid (HF) as etchant.

Afterwards, referring to FIG. 3K, the first capping layer 153 is removed by a wet etching process to expose the crystalline high-k gate dielectric layer 152', in accordance with some embodiments. The wet etching process may be a standard clean 2 (SC2) process that uses mixture of HCl, $H_2O_2$ and $H_2O$ as etchant. Thereafter, still referring to FIG. 3K, a second PDA process 166 is performed on the crystalline high-k gate dielectric layer 152' in the pMOS region 100A and the nMOS region 100B to enhance crystallization of the crystalline high-k gate dielectric layer 152', in accordance with some embodiments. The process conditions of the second PDA process 166 may be the same as or similar to those described with respect to the first PDA process 160 of FIG. 3G. The high-k quality of the crystalline high-k gate dielectric layer 152' is further improved by the second PDA process 166.

As a result of an X-ray diffraction (XRD) analysis spectrum of several $HfO_2$ gate dielectric layers formed in various gas ambiences, for example 100% $N_2$, 1% $NH_3$, 10% $NH_3$ and 100% $NH_3$ in total volume with the first PDA process 160 and the second PDA process 166 in accordance with some embodiments, each of the $HfO_2$ gate dielectric layers has orthorhombic and tetragonal phases of $HfO_2$. In addition, an X-ray diffraction (XRD) analysis spectrum of an $HfO_2$ gate dielectric layer formed without the first PDA process 160 and the second PDA process 166 shows no orthorhombic and tetragonal phases of $HfO_2$. Therefore, the crystallizing high-k gate dielectric layers 152' of some embodiments formed in various gas ambiences of 100% $N_2$, 1% $NH_3$, 10% $NH_3$ and 100% $NH_3$ in total volume with the PDA processes 160 and 166 have orthorhombic and tetragonal phases. The amorphous gate dielectric layer 152 without treatments of the PDA processes 160 and 166 has no orthorhombic and tetragonal phases.

According to embodiments of the disclosure, the crystalline high-k gate dielectric layer 152' formed by the first PDA process 160, the second PDA process 166 or the combination thereof can increase the dielectric constant of the gate dielectric layer without IL regrowth. The capacitance equivalent thickness (CET) of the gate dielectric layer is thereby reduced by the crystalline high-k gate dielectric layer 152'. In some embodiments, the first PDA process 160 and the second PDA process 166 are performed in an $NH_3$-containing ambience. The ratio of $NH_3$ in total volume of the $NH_3$-containing ambience may be equal to or below about 10%. The CET reduction of the crystalline high-k gate dielectric layer 152' can be over 1 Å while compared with the CET of the amorphous gate dielectric layer 152. Moreover, gate leakage of the semiconductor devices is thereby reduced. In some instances, the leakage current density (Jg) reduction of the semiconductor devices having the crystalline high-k gate dielectric layer 152' can be more than one order of 10 Å/cm$^2$ while compared with the Jg of the amorphous gate dielectric layer 152. Therefore, the performance of the semiconductor devices according to the embodiments of the disclosure is improved.

Next, referring to FIG. 3L, a p-type work function (pWF) layer 155 is conformally deposited on the crystalline high-k gate dielectric layer 152' in the pMOS region 100A and the nMOS region 100B, in accordance with some embodiments. The pWF layer 155 includes Ti, TiN, TaN, TiSiN, TaSiN, $TaSi_2$, Ru, $RuO_2$, Mo, MoN, $MoSi_2$, Al, $ZrSi_2$, $NiSi_2$, WN or WCN, and serves the Vt tuning of pMOS. In some embodiments, the pWF layer 155 is TiN that is deposited by ALD process using $TiCl_4$ and $NH_3$ as precursor and is performed at a temperature in a range from about 350° C. to about 450° C. In some examples, the pWF layer 155 has a thickness that is in a range from about 10 Å to about 40 Å. The thickness of the pWF layer 155 can be adjusted by varying the number of cycles in the ALD process.

Afterwards, referring to FIG. 3M, a portion of the pWF layer 155 in the nMOS region 100B is removed, in accordance with some embodiments. A patterned hard mask or photoresist (not shown) is formed on the pWF layer 155 in the pMOS region 100A to serve as an etching mask. The portion of the pWF layer 155 in the nMOS region 100B is removed by a wet etching process such as the SC2 process described with respect to FIG. 3K.

Next, referring to FIG. 3N, an n-type work function (nWF) layer 156 is conformally deposited on the crystalline high-k gate dielectric layer 152' in the nMOS region 100B and on the pWF layer 155 in the pMOS region 100A, in accordance with some embodiments. The nWF layer 156 includes Ti, TiN, TiAlC, TiAl, TiC, TiAlN, TaN, TaAlC, TaAl, TaC, TaSiN, and serves the Vt tuning of nMOS. In some embodiments, the nWF layer 156 is TiAlC that is deposited by ALD process using $TiCl_4$ and triethyl aluminium (TEAL) as precursor and is performed at a temperature in a range from about 350° C. to about 450° C. In some examples, the nWF layer 156 has a thickness in a range from about 10 Å to about 40 Å. The thickness of the nWF layer 156 can be adjusted by varying the number of cycles in the ALD process.

Afterwards, still referring to FIG. 3N, a barrier layer 157 is conformally deposited on the nWF layer 156 in the pMOS region 100A and the nMOS region 100B, in accordance with some embodiments. The barrier layer 157 is in-situ deposited by ALD process performed in the same process chamber as the deposition of the nWF layer 156. The barrier layer 157 includes TiN, TaN, TiAlN, TaAlN, TiSiN, TaSiN, TiCN, TaCN or AlN. In some embodiments, the barrier layer 157 is TiN that is deposited by ALD process using $TiCl_4$ and $NH_3$ as precursor and is performed at a temperature in a range from about 350° C. to about 450° C. In some examples, the barrier layer 157 has a thickness that is in a range from about 5 Å to about 15 Å. The thickness of the barrier layer 157 can be adjusted by varying the number of cycles in the ALD process.

Next, referring to FIG. 3O, a blocking layer 158 is conformally deposited on the barrier layer 157 in the pMOS region 100A and the nMOS region 100B, in accordance with some embodiments. The blocking layer 158 includes TiN, TaN, TiAlN, TaAlN, TiSiN, TaSiN, TiCN, TaCN or AlN. In some embodiments, the blocking layer 158 is TiN that is deposited by ALD process using $TiCl_4$ and $NH_3$ as precursor and is performed at a temperature in a range from about 350° C. to about 450° C. In some examples, the blocking layer 158 has a thickness that is in a range from about 10 Å to about 40 Å. The thickness of the blocking layer 158 can be adjusted by varying the number of cycles in the ALD process.

Afterwards, still referring to FIG. 3O, a metal film 159-1 of a metal gate fill material is conformally deposited on the blocking layer 158 in the pMOS region 100A and the nMOS region 100B, in accordance with some embodiments. The metal gate fill material includes W, Co, Al, Ru, Cu, another suitable metal material or a combination thereof. In some embodiments, the metal film 159-1 is fluorine-free tungsten (FFW) that is conformally deposited on the blocking layer 158 using ALD process to be along the sidewalls and the bottom surfaces of the trenches 126 and 136. The metal film 159-1 can serve as a seed layer or a nucleation layer used in a subsequent electrochemical plating (ECP) or deposition process to form the metal gate fill material.

Next, referring to FIG. 3P, a bulk portion 159-2 of the metal gate fill material is formed on the metal film 159-1 in the pMOS region 100A and the nMOS region 100B to fill the trenches 126 and 136, in accordance with some embodiments. In some embodiments, the metal film 159-1 is fluorine-free tungsten (FFW), and the bulk portion 159-2 is tungsten (W) that is deposited using a CVD process.

Afterwards, excess portions of the crystalline high-k gate dielectric layer 152' and the various aforementioned layers on the crystalline high-k gate dielectric layer 152' for a gate electrode layer deposited on the top surfaces of the ILD layer 144, the CESL 142 and the gate spacers 110 as shown in FIG. 3P are removed in a planarization process, such as a CMP process. Thereafter, a gate structure 170A is formed in the pMOS region 100A, and another gate structure 170B is formed in the nMOS region 100B, as shown in FIG. 3Q in accordance with some embodiments. The gate structures 170A and 170B are formed in a gate-last process with replacement gate structures. The top surface of the gate structures 170A and 170B may be coplanar with the top surfaces of the ILD layer 144, the CESL 142 and the gate spacers 110.

The remaining portions of the metal film 159-1 and the bulk portion 159-2 are together referred to as the metal gate fill material 159. In some embodiments, in the pMOS region 100A, the gate structure 170A includes the interfacial layer (IL) 150, the crystalline high-k gate dielectric layer 152', the pWF layer 155, the nWF layer 156, the barrier layer 157, the blocking layer 158 and the metal gate fill material 159 those are stacked in sequence. In the nMOS region 100B, the gate structure 170B includes the interfacial layer (IL) 150, the crystalline high-k gate dielectric layer 152', the nWF layer 156, the barrier layer 157, the blocking layer 158 and the metal gate fill material 159 those are stacked in sequence.

Figure 5:
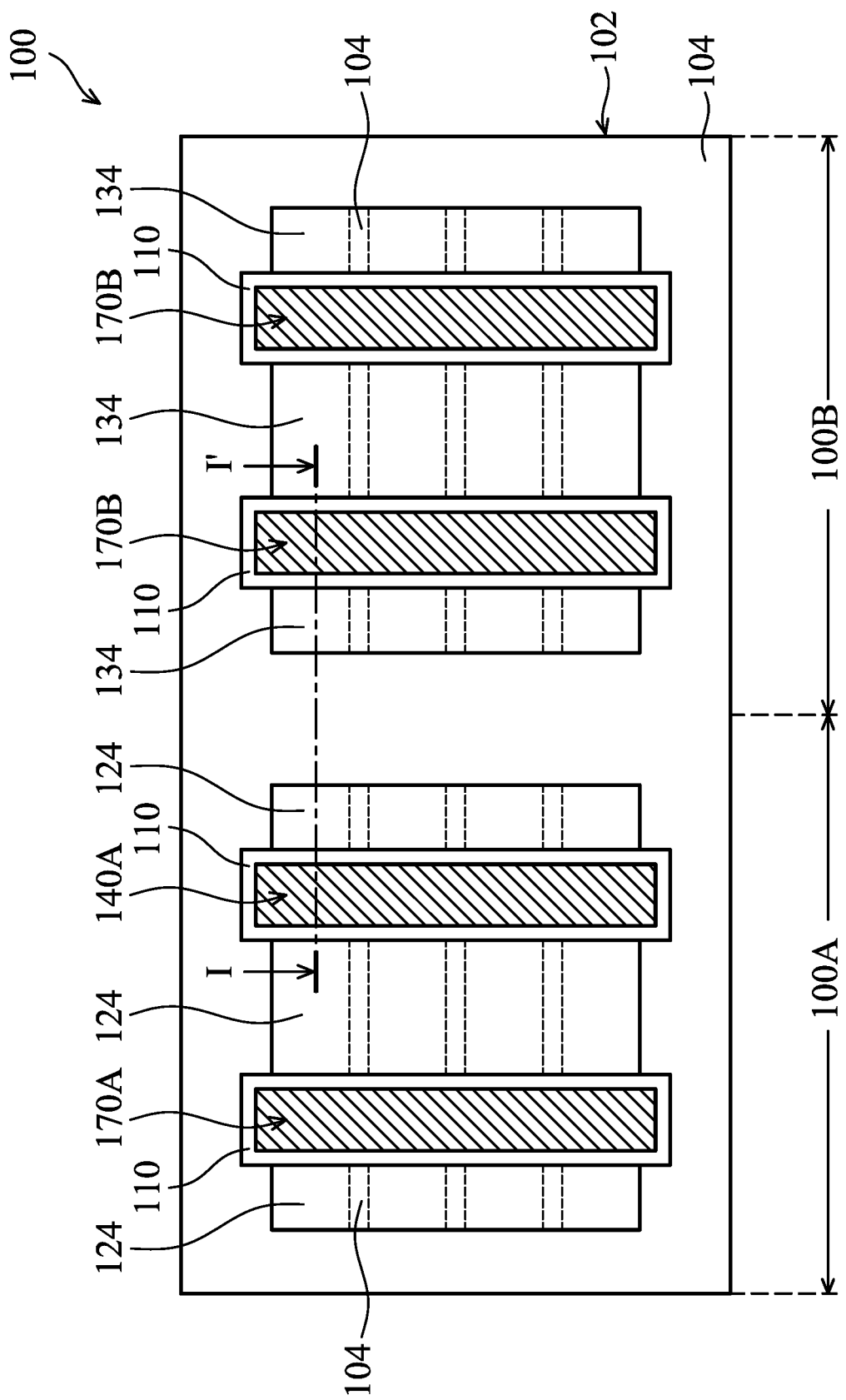
FIG. 5 shows a plane view of a semiconductor device in accordance with some embodiments.

FIG. 5 shows a plane view of the semiconductor device 100 in accordance with some embodiments. FIG. 3Q is a cross-sectional view of a portion of the semiconductor device 100 taken along line I-I' in FIG. 5, in accordance with some embodiments. Line I-I' is on a plane that is perpendicular to gate structure 170A and the gate structure 170B, along the source and drain structures 124 and 136, and along the fins 106 and 108. The semiconductor device 100 includes multiple gate structures 170A in the pMOS region 100A, and multiple gate structures 170B in the nMOS region 100B. Each of the gate structures 170A and 170B is independently surrounded by the gate spacers 110. The source and drain structures 124 are disposed on opposite sides of the gate structure 170A and formed in the recesses of the fins 106 by epitaxial growth. Also, the source and drain structures 134 are disposed on opposite sides of the gate structure 170B and in the recesses of the fins 108 by epitaxial growth.

In some embodiments, the neighboring epitaxial source or drain structures 124 of different FinFETs in the pMOS region 100A may be merged together. The merged epitaxial source or drain structures 124 may have cavities to expose the isolation structures 104 between the neighboring fins 106. Also, the neighboring epitaxial source or drain structures 134 of different FinFETs in the nMOS region 100B may be merged together. The merged epitaxial source or drain structures 134 may have cavities to expose the isolation structures 104 between the neighboring fins 108.

In some other embodiments, the neighboring epitaxial source or drain structures 124 of different FinFETs in the pMOS region 100A may be separated from each other. Also, the neighboring epitaxial source or drain structures 134 of different FinFETs in the nMOS region 100B may be separated from each other. In addition, multiple FinFETs of the pMOS region 100A are isolated from multiple FinFETs of the nMOS region 100B by the isolation structures 104 on the substrate 102. In FIG. 5, for ease of depicting the figure, some components or features (for example, the CESL 142 and the ILD layer 144) illustrated in the figures mentioned above are omitted to avoid obscuring other components or features.

Afterwards, via contacts (not shown) to the source and drain structures 124 and the source and drain structures 134 are formed in the ILD layer 144. The via contacts are formed to pass through the CESL layer 142 and to be in contact with the respective source and drain structures 124 and the respective source and drain structures 134. The via contacts are formed by forming contact holes in the ILD layer 144 and the CESL layer 142 using photolithography and etching processes. The source and drain structures 124 and the source and drain structures 134 are exposed through the contact holes.

Thereafter, the contact holes are filled with a conductive material using a deposition process. Moreover, in each of the contact holes, a liner may be conformally deposited on the sidewalls and the bottom surface of the contact hole before filling the contact hole with the conductive material. The liner may be used as a diffusion barrier layer, an adhesion layer, or a combination thereof. The material of the liner may include Ti, TiN, Ta, TaN, or the like. The liner may be deposited by ALD, PECVD, MBD, PVD, or another deposition technique. In addition, an annealing process may be performed to facilitate a reaction between some portions of the liner and the respective source and drain structures 124 and 134 to form silicide regions at the respective source and drain structures 124 and 134. The conductive material of the via contacts includes a metal, such as Co, W, Cu, Al, Au, Ag, alloys thereof, or a combination thereof, and may be deposited by CVD, ALD, PVD, or another deposition technique. Next, excess portion of the conductive material over the ILD layer 144 is removed in a planarization process, such as a CMP process, to form the via contacts.

Afterwards, an additional ILD layer (not shown) is formed on the ILD layer 144 and the gate structures 170A and 170B. Contacts to the gate structures 170A and 170B are formed in and pass through the additional ILD layer. The materials and the processes for forming the contacts to the gate structures 170A and 170B may be the same as or similar to those described above with respect to the via contacts to the respective source and drain structures 124 and 134.

According to some embodiments of the disclosure, methods for fabricating the semiconductor devices 100 such as FinFET devices with the gate structures 170A and 170B having the crystalline high-k gate dielectric layers 152' are provided. In some embodiments, the amorphous gate dielectric layer 152 is deposited on the interfacial layer (IL) 150, and then the first PDA process 160 is performed on the amorphous gate dielectric layer 152 to form the crystalline high-k gate dielectric layers 152'. Afterwards, the capping layers 153 and 154 are deposited on the crystalline high-k gate dielectric layers 152', and then the PMA process 162 and the PCA process 164 are performed to reduce oxygen vacancy in the crystalline high-k gate dielectric layers 152'. Next, the capping layers 153 and 154 are removed from the crystalline high-k gate dielectric layers 152', and the second PDA process 166 is performed on the crystalline high-k gate dielectric layers 152' to further enhance the high-k quality of the crystalline high-k gate dielectric layers 152'.

According to embodiments of the disclosure, the first PDA process 160, the second PDA process 166 or the combination thereof can crystallize the amorphous high-k material of the amorphous gate dielectric layer 152 to form the crystalline high-k gate dielectric layers 152' and avoid interfacial layer (IL) 150 regrowth. In some embodiments, the PDA processes 160 and 166 are performed in an $NH_3$-containing ambience that has the ratio of $NH_3$ in total volume equal to or below about 10%. The crystalline high-k gate dielectric layers 152' can increase the dielectric constant of the gate dielectric layer without IL regrowth, reduce the capacitance equivalent thickness (CET) of the gate dielectric layer over 1 Å, and reduce gate leakage more than one order such as reduce leakage current density (Jg) by more than 10 $Å/cm^2$ in the semiconductor devices 100 of some embodiments of the disclosure. Therefore, the semiconductor devices 100 with the crystalline high-k gate dielectric layers 152 in the gate structures 170A and 170B can increase the dielectric constant of the gate dielectric layer without IL regrowth to improve device performance. Moreover, according to the benefits mentioned above, the embodiments of the disclosure are suitable for semiconductor devices at multiple technology nodes of 20 nm (N20), N16, N10, N7, N5, N3 and beyond.

In some embodiments, a method of fabricating a semiconductor device is provided. The method includes forming an interfacial layer on a substrate, and depositing a gate dielectric layer on the interfacial layer. The method also includes treating the gate dielectric layer with a first post deposition annealing (PDA) process. The method further includes depositing a first capping layer on the gate dielectric layer, and treating the gate dielectric layer by performing a post metal annealing (PMA) process on the first capping layer. In addition, the method includes removing the first capping layer, and treating the gate dielectric layer with a second PDA process. The method also includes forming a gate electrode layer on the gate dielectric layer.

In some embodiments, a method of fabricating a semiconductor device is provided. The method includes forming an interfacial layer on a substrate in a p-type device region and an n-type device region, and depositing an amorphous gate dielectric layer on the interfacial layer. The method also includes treating the amorphous gate dielectric layer with a post deposition annealing (PDA) process to form a crystalline gate dielectric layer. The method further includes depositing a capping layer over the crystalline gate dielectric layer, treating the crystalline gate dielectric layer by performing a post cap annealing (PCA) process on the capping layer, and removing the capping layer. In addition, the method includes depositing a p-type work function layer on the crystalline gate dielectric layer in the p-type device region, and depositing an n-type work function layer on the crystalline gate dielectric layer in the n-type device region and on the p-type work function layer in the p-type device region. The method also includes forming a metal gate fill material over the n-type work function layer in the p-type device region and the n-type device region.

In some embodiments, a semiconductor device is provided. The semiconductor device includes a fin protruding from a semiconductor substrate, and a gate structure over and along sidewalls of the fin. The gate structure includes an interfacial layer on the fin, a crystalline gate dielectric layer on the interfacial layer, and a gate electrode layer on the crystalline gate dielectric layer. The semiconductor device also includes source and drain structures disposed on opposite sides of the gate structure and in the fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method of fabricating a semiconductor device, comprising:
 forming an interfacial layer on a substrate;
 depositing a gate dielectric layer on the interfacial layer;

treating the gate dielectric layer with a first post deposition annealing (PDA) process;
depositing a first capping layer on the gate dielectric layer;
treating the gate dielectric layer by performing a post metal annealing (PMA) process on the first capping layer;
removing the first capping layer;
treating the gate dielectric layer with a second PDA process; and
forming a gate electrode layer on the gate dielectric layer.

2. The method as claimed in claim 1, wherein the gate dielectric layer comprises $HfO_2$, $Al_2O_3$, $ZrO_2$, $La_2O_3$, BaO, $TiO_2$, $Ta_2O_5$, $Pr_2O_3$ or $Y_2O_3$ and is an amorphous gate dielectric layer deposited by an atomic layer deposition (ALD) process, and the first PDA process and the second PDA process crystallize the amorphous gate dielectric layer to form a crystalline gate dielectric layer.

3. The method as claimed in claim 1, wherein each of the first PDA process and the second PDA process comprises a soak annealing and a flash annealing that are performed in an $NH_3$-containing ambience.

4. The method as claimed in claim 3, wherein the $NH_3$-containing ambience comprises $N_2$ and $NH_3$, and the ratio of $NH_3$ in total volume is equal to or below about 10%.

5. The method as claimed in claim 3, wherein the soak annealing is performed at a temperature in a range from about 550° C. to about 650° C., and the flash annealing is performed at a temperature in a range from about 950° C. to about 1150° C.

6. The method as claimed in claim 1, further comprising:
depositing a second capping layer on the first capping layer after the PMA process;
treating the gate dielectric layer by performing a post cap annealing (PCA) process on the second capping layer; and
removing the second capping layer before removing the first capping layer.

7. The method as claimed in claim 6, wherein the second PDA process is performed on the gate dielectric layer after the second capping layer is removed.

8. The method as claimed in claim 6, wherein the first capping layer comprises titanium nitride (TiN) or titanium silicon nitride (TiSiN) and is deposited using an atomic layer deposition (ALD) process, and the second capping layer comprises silicon (Si) and is deposited using a chemical vapor deposition (CVD) process.

9. The method as claimed in claim 6, wherein depositing the gate dielectric layer, the first PDA process and the second PDA process are in-situ performed in a first process chamber, and the PMA process and the PCA process are ex-situ performed in a second process chamber.

10. The method as claimed in claim 1, wherein the first PDA process and the second PDA process are ex-situ performed in a second process chamber that is different from a first process chamber for depositing the gate dielectric layer.

11. A method of fabricating a semiconductor device, comprising:
forming an interfacial layer on a substrate in a p-type device region and an n-type device region;
depositing an amorphous gate dielectric layer on the interfacial layer;
treating the amorphous gate dielectric layer with a post deposition annealing (PDA) process to form a crystalline gate dielectric layer;
depositing a capping layer over the crystalline gate dielectric layer;
treating the crystalline gate dielectric layer by performing a post cap annealing (PCA) process on the capping layer;
removing the capping layer;
depositing a p-type work function layer on the crystalline gate dielectric layer in the p-type device region;
depositing an n-type work function layer on the crystalline gate dielectric layer in the n-type device region and on the p-type work function layer in the p-type device region; and
forming a metal gate fill material over the n-type work function layer in the p-type device region and the n-type device region.

12. The method as claimed in claim 11, further comprising treating the crystalline gate dielectric layer with an additional PDA process after the capping layer is removed and before depositing the p-type work function layer.

13. The method as claimed in claim 12, wherein each of the PDA process and the additional PDA process comprises a soak annealing performed at a first temperature, and a flash annealing performed at a second temperature that is higher than the first temperature, and the flash annealing is performed after the soak annealing.

14. The method as claimed in claim 12, wherein both the PDA process and the additional PDA process are performed in an $NH_3$-containing ambience, and the ratio of $NH_3$ in total volume is equal to or below about 10%.

15. The method as claimed in claim 11, further comprising:
depositing an additional capping layer on the crystalline gate dielectric layer before depositing the capping layer, wherein the additional capping layer comprises titanium nitride (TiN) or titanium silicon nitride (TiSiN);
treating the crystalline gate dielectric layer by performing a post metal annealing (PMA) process on the additional capping layer; and
removing the additional capping layer.

16. The method as claimed in claim 15, wherein the capping layer comprises silicon and is deposited on the additional capping layer using a chemical vapor deposition (CVD) process after the PMA process.

17. A method of fabricating a semiconductor device, comprising:
forming an interfacial layer on a substrate;
depositing a gate dielectric layer on the interfacial layer;
treating the gate dielectric layer with a first post deposition annealing (PDA) process;
depositing a first capping layer on the gate dielectric layer;
treating the gate dielectric layer by performing a post metal annealing (PMA) process on the first capping layer;
depositing a second capping layer on the first capping layer;
treating the gate dielectric layer by performing a post cap annealing (PCA) process on the second capping layer;
removing the first capping layer and the second capping layer;
treating the gate dielectric layer with a second PDA process, wherein the gate dielectric layer has an orthorhombic phase and a tetragonal phase after the second PDA process; and
forming a gate electrode layer on the gate dielectric layer.

18. The method as claimed in claim 17, wherein each of the first PDA process and the second PDA process comprises a soak annealing performed in a first time and a first temperature followed by a flash annealing performed in a second time and a second temperature, the second time is less than the first time, and the second temperature is higher than the first temperature.

19. The method as claimed in claim 17, wherein forming the gate electrode layer comprises:
   forming a first work function layer over the gate dielectric layer;
   forming a barrier layer over the first work function layer; and
   forming a metal gate fill material over the barrier layer.

20. The method as claimed in claim 19, wherein forming the metal gate fill material comprises:
   conformally depositing a metal film over the barrier layer; and
   forming a bulk portion of the metal gate fill material on the metal film.

* * * * *